United States Patent
Cannell et al.

(10) Patent No.: US 6,729,383 B1
(45) Date of Patent: May 4, 2004

(54) FLUID-COOLED HEAT SINK WITH TURBULENCE-ENHANCING SUPPORT PINS

(75) Inventors: Michael J. Cannell, Annapolis, MD (US); Roger Cooley, Crownsville, MD (US); Richard W. Garman, Crownsville, MD (US); Geoffrey Green, Shady Side, MD (US); Peter N. Harrison, Cumberland, MD (US); Joseph D. Walters, Arnold, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/464,080

(22) Filed: Dec. 16, 1999

(51) Int. Cl.[7] .................................................. F28F 7/00
(52) U.S. Cl. ..................... 165/80.3; 165/80.4; 165/185; 361/700; 257/714
(58) Field of Search .............................. 165/80.3, 80.4, 165/122, 185; 361/399; 257/714, 722

(56) References Cited

U.S. PATENT DOCUMENTS

| | | | | |
|---|---|---|---|---|
| 2,942,165 A | * | 6/1960 | Jackson et al. ............ | 165/80.4 |
| 3,912,001 A | | 10/1975 | Missman et al. | |
| 4,151,548 A | * | 4/1979 | Klein et al. ................ | 165/80.4 |
| 4,188,996 A | * | 2/1980 | Pellant et al. .............. | 165/80.4 |
| 4,521,170 A | | 6/1985 | Klein | |
| 4,712,609 A | | 12/1987 | Iversen | |
| 4,989,070 A | | 1/1991 | Iversen et al. | |
| 4,997,034 A | * | 3/1991 | Steffen et al. .............. | 165/122 |
| 5,275,237 A | * | 1/1994 | Rolfson et al. ............. | 165/80.4 |
| 5,316,077 A | | 5/1994 | Reichard | |
| 5,370,178 A | | 12/1994 | Agonafer et al. | |
| 5,453,911 A | * | 9/1995 | Wolgemuth et al. ....... | 165/80.4 |
| 5,482,113 A | | 1/1996 | Agonafer et al. | |
| 5,522,452 A | | 6/1996 | Mizuno et al. | |
| 5,666,269 A | | 9/1997 | Romero et al. | |
| 5,829,516 A | | 11/1998 | Lavochkin | |
| 5,870,823 A | * | 2/1999 | Bezama et al. ............ | 165/80.4 |
| 5,894,882 A | | 4/1999 | Kikuchi et al. | |
| 5,978,220 A | * | 11/1999 | Frey et al. ................. | 165/80.4 |
| 6,039,114 A | * | 3/2000 | Becker et al. ............. | 165/80.4 |

FOREIGN PATENT DOCUMENTS

| | | | | |
|---|---|---|---|---|
| GB | 758524 | * | 10/1956 | ................ 165/80.4 |
| GB | 872894 | * | 7/1961 | ................ 165/80.4 |
| JP | 8-195453 | * | 7/1996 | ................ 165/80.3 |

* cited by examiner

*Primary Examiner*—Christopher Atkinson
(74) *Attorney, Agent, or Firm*—Howard Kaiser

(57) ABSTRACT

A pin array is connectively disposed between a surface region of a heat sink and a surface region of an entity to be cooled. Cooling fluid flows between the heat sink's surface region and the entity's surface region, the fluid flowing adjacent each surface region and through the space occupied by the pins, the fluid thereby being agitated by the pins. Frequent inventive practice attributes the pins with supportability of the entity. The pins can be made to be thermally nonconductive, the heat transfer thus being primarily founded on thermally convective principles involving the cooling fluid, the invention thus being effective in the absence of significant heat conduction from the entity to the heat sink. Typical inventive practice prescribes that a given array is patterned in an orderly fashion, all pins therein are parallel and each pin therein has the same cross-sectional geometry; however, there can be disparity between or among pins in any or all such respects. A pin's cross-sectional geometry can describe any shape—rectilinear, curvilinear or some combination thereof. The configurational regularity of the pins promotes the uniformity of heat transference from the entity's surface region.

41 Claims, 34 Drawing Sheets

FLUID-COOLED HEAT SINK WITH TURBULENCE-ENHANCING SUPPORT PINS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to methods and apparatuses for cooling electronic components and other objects, more particularly to such methods and apparatuses involving removal, absorption and/or dissipation of heat.

A "heat sink" (alternatively spelled "heatsink") is a device used for removing, absorbing and/or dissipating heat from a thermal system. Generally speaking, conventional heat sinks are founded on well known physical principles pertaining to heat transference. Heat transference concerns the transfer of heat (thermal energy) via conduction, convection, radiation or some combination thereof. In general, heat transfer involves the movement of heat from one body (solid, liquid, gas or some combination thereof) to another body (solid, liquid, gas or some combination thereof).

The term "conduction" (or "heat conduction" or "thermal conduction") refers to the transmission of heat via (through) a medium, without movement of the medium itself, and normally from a region of higher temperature to a region of lower temperature. "Convection" (or "heat convection" or "thermal convection") is distinguishable from conduction and refers to the transport of heat by a moving fluid which is in contact with a heated body. According to convection, heat is transferred, by movement of the fluid itself, from one part of a fluid to another part of the fluid. "Radiation" (or "heat radiation" or "thermal radiation") refers to the emission and propagation of waves or particles of heat. The three heat transference mechanisms (conduction, convection and radiation) can be described by the relationships briefly discussed immediately hereinbelow.

Conductive heat transfer, which is based upon the ability of a solid material to conduct heat therethrough, is expressed by the equation $q=kA\Delta T/l$, wherein: $q$=the rate of heat transfer (typically expressed in watts) from a higher temperature region to a lower temperature region which is in contact with the higher temperature region; $k$=the conduction coefficient or conductivity (w/m-c), which is a characteristic of the material composition; $A$=the surface area (m$^2$) of the material perpendicular to the direction of heat flow; $\Delta T$=the temperature difference (° C.), e.g., the amount of temperature drop between the higher temperature region and the lower temperature region; and $l$=length (m) of the thermal path through which the heat is to flow (e.g., material thickness).

Convective heat transfer, which is based upon the ability of a replenishable fluid (e.g., air or water) to absorb heat energy through intimate contact with a higher temperature solid surface, is expressed by the equation $q=hA\Delta T$, wherein: $h$=the fluid convection coefficient (w/m$^2$-° C.), wherein h is determined by factors including the fluid's composition, temperature, velocity and turbulence; and, $A$=the surface area (m$^2$) which is in contact with the fluid.

Radiative heat transfer, which is based upon the ability of a solid material to emit or absorb energy waves or particles from a solid surface to fluid molecules or to different temperature solid surfaces, is expressed by the equation $q=A\epsilon\check{o}(T_s^4-T_\infty^4)$, wherein: $\epsilon$=the dimensionless emissivity coefficient of a solid surface, characteristic of the material surface; $\check{o}$=the Stefan-Boltzmann constant; $A$=the surface area (m$^2$) which radiates heat; $T_s$=absolute temperature of the surface (K); and, $T\infty$=absolute temperature of the surrounding environment (K).

It is theoretically understood that, regardless of the heat transfer mechanism, heat transfer rate q can be increased by increasing one or more factors on the right side of the equation—viz., the heat transfer coefficient (k, h or E), and/or the (surface or cross-sectional) area A and/or the temperature reduction $\Delta T$—and/or by reducing the path length l.

In current practical contexts, heat sinks generally are designed with a view toward furthering the conductive properties of the heat sink by augmenting or optimizing the conduction coefficient k, the surface area A and the path length l. Conduction coefficient k depends on the materiality of the heat sink. In this regard, according to conventional practice, a heat sink structure is made of a thermally conductive solid material, thereby maximizing the conduction coefficient k characteristic of the heat sink. In addition, the heat sink structure tends to be rendered large (e.g., bulky or voluminous), especially the portion thereof which contacts the to-be-cooled body, thereby maximizing the cross-sectional area A or minimizing the path length l which are design characteristic of the heat sink.

Generally speaking, the materials conventionally used in the industry for heat sink manufacture are characterized by high heat conductivity and low weight. These materials are usually a metal or metal alloy. The most common materials used in the manufacture of heat sinks are aluminum and copper. These materials are often coated with nickel or another finish to prevent corrosion. Metal alloy materials are also finding their way into the mainstream of heat sink design, provided they have a high thermal conductivity and a low weight.

All conventional heat sinks which have been observed, including those which are commercially available, effectuate some form of conductive heat transfer, and are primarily dependent thereon or governed thereby. Conventional heat sinks mainly rely on heat conduction through a solid-on-solid contacting interface between the tobe-cooled object and the heat sink device. These conventional devices are typically fabricated from a high heat-conducting material, generally a metallic material.

Many conventional heat sinks feature various arrangements and configurations of protrusive structuring (e.g., pins, fins, pins-and-fins, mazes, etc.) which are intended to increase the heat sink's size parameters (cross-sectional area A), thereby increasing the amount of conductive heat transfer surface (i.e., the amount of conductive heat dissipation/removal). The protrusive structuring is rendered to be thermally conductive and to increase the overall heat transfer coefficient the heat sink.

Some of these conventional devices implement cooling fluid flow (e.g., water or air) which passes through the heat sink's protrusive structure or structures, or which otherwise contacts solid material of the heat sink. In all such known applications, the heat sink is adapted to first being thermally conductive, and the fluid is adapted to then being thermally convective with respect to heat which has previously been thermally conducted by the heat sink.

Typically in conventional practice, a sizable mass (e.g., a block) of a thermally conductive solid substance (e.g., a metallic material) is placed in direct contact with the high temperature body. Nevertheless, heat sink applications involving a high power density (i.e., high heat flux, or high heat dissipation over a small surface area) do not ideally lend themselves to a cooling methodology wherein a thermally conductive material directly contacts a body which operates at a high power density. Some of the potential detriment stems from the normal circumstance that the thermally conductive material is metallic.

Metals are characterized by the presence of relatively free electrons, and hence are characterized by high thermal conductivity as well as high electrical conductivity. There exists a relation between the thermal conductivity of a metal to its electrical conductivity; pursuant to the Wiedemann-Franz law, for instance, the ratio of the thermal conductivity of any pure metal to its electrical conductivity is about the same at the same given temperature. As pertains to conventional heat sink practice, the thermally conductive material which is implemented generally will be a metal and therefore will also be electrically conductive.

Thus, there are potential problems associated with conventional approaches to effectuating heat sink cooling of an entity behaving at a high power density. First of all, a conventional heat sink arrangement will usually demand a large amount of thermally conductive material in order to dissipate the heat. Moreover, the thermally conductive material is typically metallic and hence is subject to corrosion from its environment. The corrosive influence may be heightened when the metallic material comes into contact with a liquid. In addition, the electrically conductive nature of the metallic material promotes the corrosiveness thereof through electrochemical means, particularly when contacting a liquid. Furthermore, some cooling applications require or preferably implement electrically nonconductive material in the heat sink. For instance, the electrically conductive heat sink material can pose a short-circuitry risk or otherwise represent an electrical threat or hazard.

The United States Navy recently encountered a situation which revealed some deficiencies of conventional heat sink technology. The Naval Surface Warfare Center, Carderock Division, took part in a research and development program for power electronics, known as the "PEBB" program. The letters "PEBB" acronymously represent "Power Electronics Building Block." A PEBB has been described as a "universal power processor"; that is, a PEBB can change any electrical power input to any desired form of voltage, current and frequency output. The U.S. Government and U.S. industry are jointly participating in a PEBB program for developing a new family of semiconductor devices for the power electronic industry. An objective of the PEBB program is to promote modularization and standardization to power electronics, similarly as has been accomplished in the realm of computers and microchips.

Demonstration power conversion units were to be produced by the U.S. Navy, according to this PEBB program. These demonstration units were to utilize power modules developed as part of this program by a commercial semiconductor manufacturer. These developmental modules were required to operate at high power densities. The semiconductor devices were to be mounted to a dielectric (electrically nonconductive) baseplate, typically manufactured from ceramic materials, which is subject to breakage when a module fails.

It was therefore necessary, in this PEBB R & D program, for the U.S. Navy to effectuate heat dissipation/removal technology which would satisfy certain criteria. Firstly, in order to be feasible for shipboard applications, the size and weight of the power electronic module and its corresponding heat sink apparatus had to be kept to a minimum.

Environmental factors had to be considered; for example, utilization of chemicals for heat dissipation could be hazardous in a shipboard environment. Uniform cooling and mechanical support had to be provided, within the heat sink, to the ceramic baseplate. Low manufacture and assembly costs were also important issues. High reliability and low maintainability were important issues, as well.

A notable inadequacy of current heat sink technologies is their inability to satisfactorily afford mechanical support to certain entities, particularly to dielectric materials (such as ceramic materials) characterized by brittleness and by lower thermal conductivity than most metals. According to current state-of-the-art heat sink devices, mechanical support is provided within the metallic (metal or metal alloy) materials which are used to conduct the heat through the heat sink device. Aside from the size and weight penalties characteristic of these current devices, they will also be subject to the inefficiencies and high costs associated with attachment of the ceramic baseplate to the metallic heat sink device.

Of interest in the art are the following United States patents, each of which is hereby incorporated herein by reference: Kikuchi et al. U.S. Pat. No. 5,894,882 issued Apr. 20, 1999; Lavochkin U.S. Pat. No. 5,829 516 issued Nov. 3, 1999; Romero et al. U.S. Pat. No. 5,666,269 issued Sep. 9, 1997; Mizuno et al. U.S. Pat. No. 5,522,452 issued Jun. 4, 1999; Agonafer et al. U.S. Pat. No. 5,482,113 issued Jan. 9, 1996; Agonafer et al. U.S. Pat. No. 5,370,178 issued Dec. 6, 1994; Reichard U.S. Pat. No. 5,316,077 issued May 31, 1994; Iversen et al. U.S. Pat. No. 4,989,070 issued Jan. 29, 1991; Iversen U.S. Pat. No. 4,712,609 issued Dec. 15, 1987; Klein U.S. Pat. No. 4,521,170 issued Jun. 4, 1985; Missman et al. U.S. Pat. No. 3,912,001 issued Oct. 14, 1975.

SUMMARY OF THE INVENTION

In view of the foregoing, it is an object of the present invention to provide heat sink method and apparatus which are capable of dissipating/removing heat from a device or other to-be-cooled object which is characterized by a high power density.

It is another object of the present invention to provide heat sink method and apparatus which are capable of providing mechanical support for a to-be-cooled object.

Another object of this invention is to provide such supportively capable method and apparatus which can provide mechanical support for a to-be-cooled object (such as a module) having a baseplate, providing such mechanical support by supporting the baseplate, especially when the baseplate is made of a brittle material such as ceramic.

A further object of this invention is to provide heat sink method and apparatus which provides cooling, for a to-be-cooled object (such as a module) having a baseplate, wherein the cooling is uniform over the entire surface area of the baseplate.

Another object of the present invention is to provide heat sink method and apparatus which are not large, cumbersome or heavy.

A further object of this invention is to provide heat sink method and apparatus wherein the heat sink admits of being made of a material which is at least substantially noncorrosive.

Another object of this invention is to provide heat sink method and apparatus wherein the heat sink admits of being made of a material which is at least substantially dielectric.

A further object of the present invention is to provide heat sink method and apparatus which are environmentally "friendly."

The present invention provides a heat sink for cooling an object, and a methodology for accomplishing same. The inventive heat sink is capable of being used in association with a fluid (liquid or gas) for effectuating cooling. Either liquid coolant or gas coolant can be used in inventive practice.

This invention is especially propitious for cooling an object such as a power electronic module having a flat (e.g., ceramic) baseplate which is susceptible to breakage in the event of a module failure. Featured by the present invention is direct contact of a coolant (e.g., water) stream with the high temperature object being cooled.

The present invention further features turbulence enhancement of the coolant stream by a pin array through which the coolant stream passes. According to many embodiments, this invention additionally features the affording of mechanical support of the object being cooled, while maintaining high heat flux cooling of such object (e.g., a power electronic module); the invention's pins are upright, post-like members which act as supporting structures.

In accordance with many embodiments of the present invention, a heat sink device for utilization in association with fluid for cooling an object comprises a structure which includes a foundation section and plural protrusions. The foundation section has an upper surface. The protrusions are situated on the upper surface. The structure is adaptable to engagement with the object and to association with the fluid wherein: the object and some or all of the protrusions touch; and, the fluid streams approximately tangentially with respect to the upper surface and with respect to the object. According to typical inventive practice, the structure is adaptable to such engagement and association wherein at least one protrusion affects the streaming of the fluid—more typically, wherein plural protrusions, which are some or all of the protrusions, affect the streaming of the fluid.

The inventive cooling apparatus is for application to any body—for example, an electronic circuitry device or other electronic component.

The inventive fluid-cooling heat sink apparatus typically comprises fluidity means (e.g., a fluid generation system) and a member. The subject body has a body surface portion. The member has a member surface portion and a plurality of pins projecting therefrom. According to frequent inventive practice the pins are approximately parallel; however, such parallelness is not required in accordance with the present invention. Each pin has a pin end surface portion opposite the member surface portion. The fluidity means includes means emissive of a fluid which is flowable along at least a part of the member surface portion so as to be contiguous at least a part of the body surface portion when at least a part of the body surface portion communicates with at least some of the pin end surface portions. Typically, the pins are arranged and configured in such manner as to be capable of increasing the turbulence of the fluid which passes between the member surface portion and the body surface portion.

Many inventive embodiments provide a method for cooling an entity such as an electronic component. The inventive method comprises the folilowing steps: (a) providing a device having a device surface area and plural members which jut from the device surface area, the members having corresponding extremities opposite the device surface area; (b) associating the entity with the device, the entity having an entity surface area, the associating including placing the entity surface area in contact with at least some of the extremities; and (c) discharging fluid between the device surface area and the entity surface area so as to be disturbed by at least some of the members.

This invention meets all of the U.S. Navy's requirements for dissipating/removing heat pursuant to its aforementioned power electronics program. The inventive heat sink: provides mechanical support to the module baseplate; is capable of dissipating heat from high power density devices; provides uniform cooling over the entire baseplate surface area; is small, lightweight and compact; and, carries relatively low manufacture and assembly costs.

The term "pin," as used herein in relation to the present invention, refers to any member of any shape resembling or suggesting that of a rod, pole, staff, peg, post or pin, wherein the member juts, protrudes or projects, in post-like fashion, from a substrate. In accordance with many embodiments of the present invention, the pins may be made of a thermally conductive material such as metal, thereby complementing heat convection by the working fluid with heat conduction by the pins.

However, it was desirable for the U.S. Navy to reduce, minimize or eliminate metallic material in the heat sink assembly. In accordance with many embodiments of the present invention, the inventive post-like pins conduct no heat; the pins are made of a thermally nonconductive material such as plastic. According to some such inventive embodiments, the foundation section from which the pins project are also made of a thermally nonconductive material such as plastic; many such embodiments provide an integral thermally nonconductive structure comprising a foundation section and plural pins projecting therefrom.

According to inventive embodiments which thus implement thermally nonconductive pins, there is no significant or appreciable thermal conductivity; all or practically all of the heat which is removed from the to-be-cooled object is removed via convection, wherein the cooling fluid comes into direct contact with a surface or surface portion of the to-be-cooled object. A thermally nonconductive material will generally be a nonmetallic material; hence, the undesirable presence of metallic material in the heat sink, and the corrosion problems that are associated therewith, are advantageously eliminated by the present invention.

For instance, in inventive applications involving a module having a dielectric (e.g., ceramic) baseplate, the entirety of the heat is removed through the baseplate by the working fluid (e.g., water or air). The invention's pins serve as mechanical support for the ceramic baseplate and to enhance the turbulent flow of the working fluid; the turbulent flow increases the heat-removal effectiveness of the working fluid. The present invention not only provides support for the baseplate to prevent breakage, but also cools the baseplate uniformly over the baseplate's surface area. By virtue of its patterned pin configuration, the present invention's performance is uniform, consistent and predictable.

The mechanically supportive functionality of the invention's pins beneficially obviates the need for a "thermal interface" or other means of attachment of a heat sink with respect to the item to be cooled. The present invention thus avoids the conventional need to furnish attachment-purposed structure, which is counterproductive to efficiency. Therefore, as compared with conventional heat sink methodologies in general, the present invention is simpler and more cost-effective to manufacture, since nothing is required to be attached to the module baseplate.

It should be understood that, according to this invention, the pins do not necessarily project from the heat sink's base section. Key inventive features are that the pins are interposed between the object to be cooled, a heat sink surface bounds the working fluid flow on one side, and a to-be-cooled object surface bounds the working fluid flow on the opposite side. In inventive practice, the pins can project from either (i) a baseplate which is part of a module for holding an electronic component, or (ii) a base section which is part of the heat sink device, this base section itself representing a sort of "baseplate."

The invention can thus operate regardless of which of two opposing substrates the pins project from, viz., an object surface (e.g., a "modular baseplate surface") or a heat sink surface (e.g., a "heatsink baseplate surface"). Therefore, according to many embodiments, a cooling assembly comprises a modular baseplate, a heatsink baseplate, plural pins and a replenishable fluid. The pins connect the modular baseplate and the heatsink baseplate. The replenishable fluid is disposed between the modular baseplate and the heatsink baseplate so as to be disrupted by at least some of the pins. Such inventive arrangements can prove especially propitious for applications involving high heat fluxes, wherein the modular baseplate (and perhaps the rest of the module, as well) is made of a dielectric material, e.g., a nonmetallic material such as ceramic, and thereby affords electrical isolation to the electronic component which is housed by the module.

Other objects, advantages and features of this invention will become apparent from the following detailed description of the invention when considered in conjunction with the accompanying drawings.

BRIEF DESCRIPTION OF THE APPENDICES

The following appendices are hereby made a part of this disclosure:

Attached hereto marked APPENDIX A and incorporated herein by reference is the following conference presentation (58 pp): Michael Cannell, Roger Cooley, Joseph Borraccini, "NSWC PEBB Hardware Development Progress," presented at the *PEBB Design Review* in Charleston, S.C., Jan. 27, 1999. See, especially, the pages therein entitled "PEBB Thermal Management."

Attached hereto marked APPENDIX B and incorporated herein by reference is the following conference presentation (28 pp): Pete Harrison, Richard Garman, Joseph Walters, "PEBB Thermal Management," presented at the *PEBB Design Review* in Charleston, S.C., Jan. 27, 1999. See, especially, pages 21 through 27.

Attached hereto marked APPENDIX C and incorporated herein by reference is the following conference paper (17 pp): Richard Garman, "PEBB Thermal Management using ANSYS Multiphysics," *ANSYS User's Conference*, Jun. 10, 1999.

Attached hereto marked APPENDIX D and incorporated herein by reference is the following conference presentation (24 pp): Richard Garman, "PEBB Thermal Management using ANSYS Multiphysics," presented at the ANSYS User's Conference, Jun. 10, 1999.

Attached hereto marked APPENDIX E and incorporated herein by reference is the following informal paper (11 pp, including several photographs): Michael Cannell et al., "NSWC Manifold Installation," which discloses an assembly procedure for the turbulence enhancing support pins heat sink, in accordance with the present invention.

Attached hereto marked APPENDIX F and incorporated herein by reference are the following drawings (presented herein as two sheets, representing one large sheet): Dr. Peter N. Harrison et al., fabrication drawings for the turbulent enhancing support pins heat sink manifold, in accordance with the present invention.

BRIEF DESCRIPTION OF THE DRAWINGS

In order that the present invention may be clearly understood, it will now be described, by way of example, with reference to the accompanying drawings, wherein like numbers indicate the same or similar components, and wherein.

DETAILED DESCRIPTION OF THE INVENTION

Figure 1:
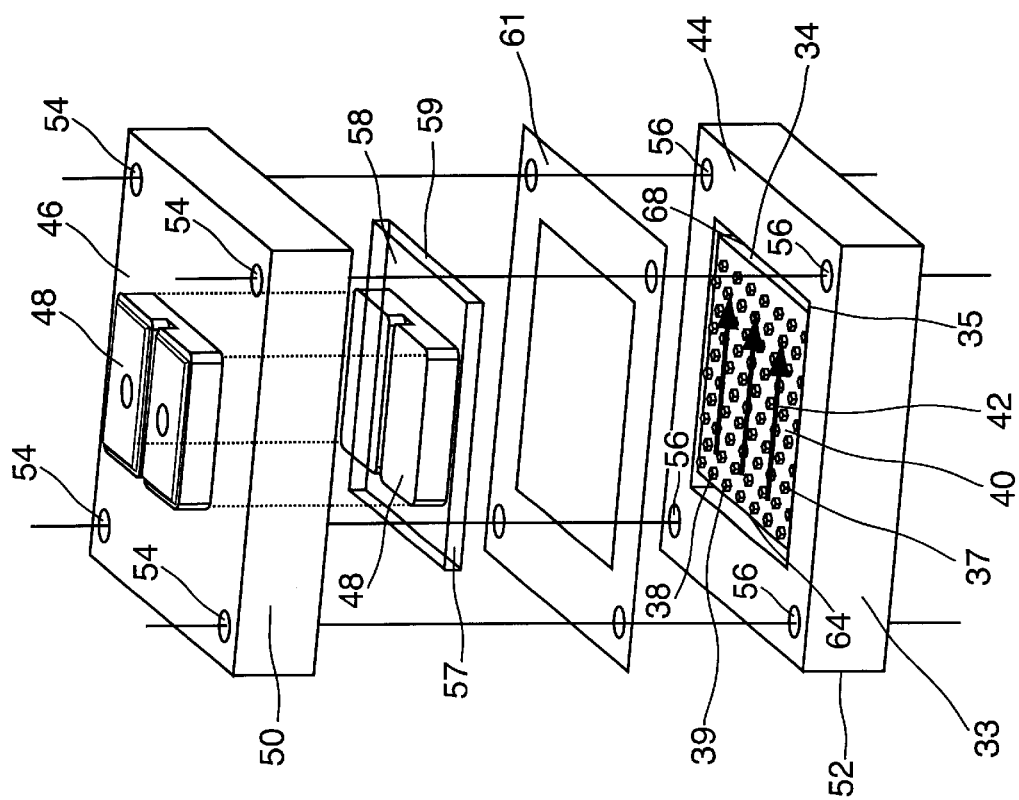
FIG. 1 is a diagrammatic exploded perspective view of an embodiment of an inventive heat sink device, illustrating adaptability thereof (using a manifold housing) to engagement with a module baseplate.

Referring now to FIG. 1 through FIG. 4, manifold 33 is a housing fairly representative of that which was used by the U.S. Navy in association with testing of its inventive prototype. Manifold 33 houses support post block 34. Support post block 34 includes a rectangular plate-like foundation (base) 36 and a plurality of turbulence-enhancing support pins 38 which project from foundation 36. Each pin 38 has a pin end surface 39 which is opposite its pin root 37. Foundation 36 has an upper foundation surface 40 and a lower foundation surface 41. Each pin 38 is based at its pin root 37 in upper foundation surface 40.

Manifold 33 further serves to channel the cooling fluid (liquid or gas) 42 through support pins 38, thereby enhancing turbulent flow. Manifold 33 also provides an upper manifold surface 44 for mounting the object (e.g., device) to be cooled, such as power conversion module 46 which holds one or more electronic components 48.

Power conversion module 46 includes module housing 50, which houses the device baseplate 57. Device baseplate 57 has a lower baseplate surface 58 and an upper baseplate surface 59. Manifold-heatsink unit 52 comprises manifold 33 and heat sink 34.

Figure 2:
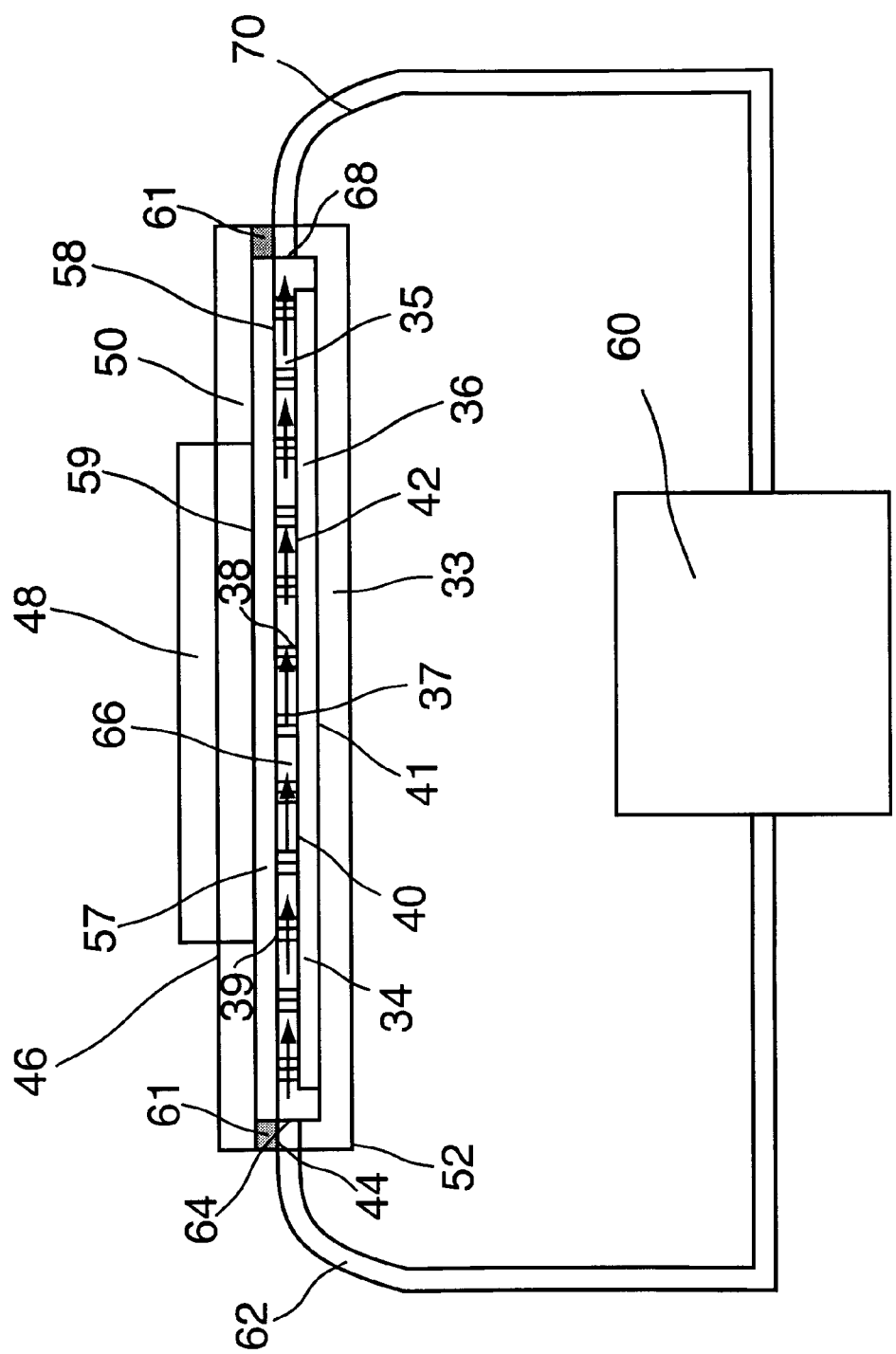
FIG. 2 is a diagrammatic schematic side elevation cutaway view of the heat sink embodiment, manifold housing embodiment and module baseplate embodiment shown in FIG. 1, wherein the inventive heat sink device and manifold housing are shown in engagement with the module baseplate.

As illustrated in FIG. 1 and FIG. 2, power conversion module 46 is coupled with manifold-heatsink unit 52. A seal (e.g., gasket or O-ring) 61 is provided with a cut-out to accommodate support post block 34, device baseplate 57, four corner module housing locations 54 and four corner manifold locations 56. Seal 61 is sandwiched between power conversion module 46 and manifold 33.

Module housing 50 is attached to manifold 33 wherein lower baseplate surface 58 is contiguous with respect to the pin ends 39, the upper manifold surface 44 and seal 61; for example, seal 61 is positioned on upper manifold surface 44 and fastened to module housing 50 (e.g., via nuts and bolts) at the four corner modular locations 54 in correspondence with the four corner manifold locations 56.

Once power conversion module 46 and manifold-heatsink unit 52 are joined, pin ends 39 of support pins 38 contact the device baseplate 57 at its lower baseplate surface 58. Pins 38, post-like members arranged in a regular array, occupy fluid passage 66.

Figure 3:
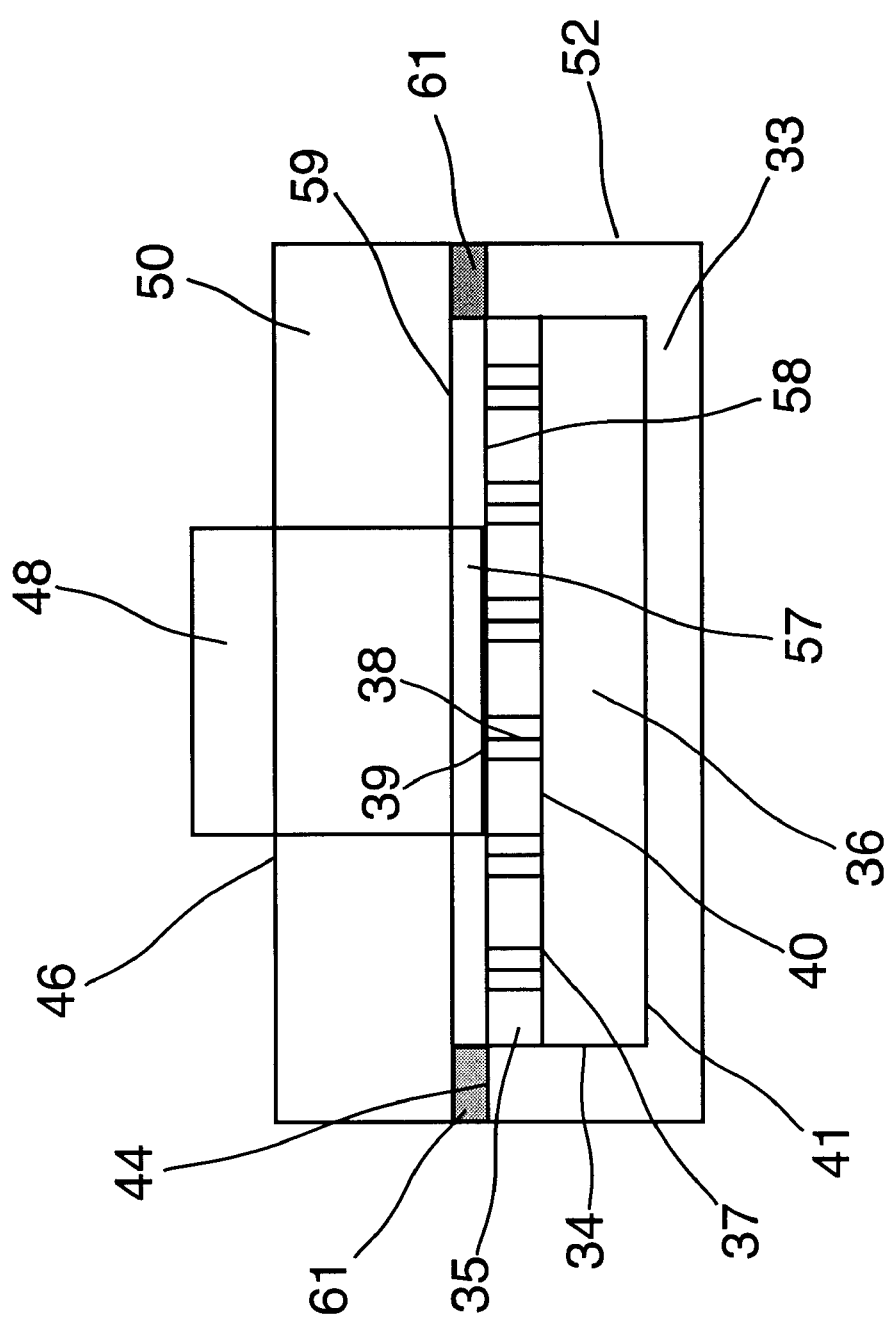
FIG. 3 is a diagrammatic end elevation cutaway view at an approximate right angle to the view shown in FIG. 2.
Figure 4:
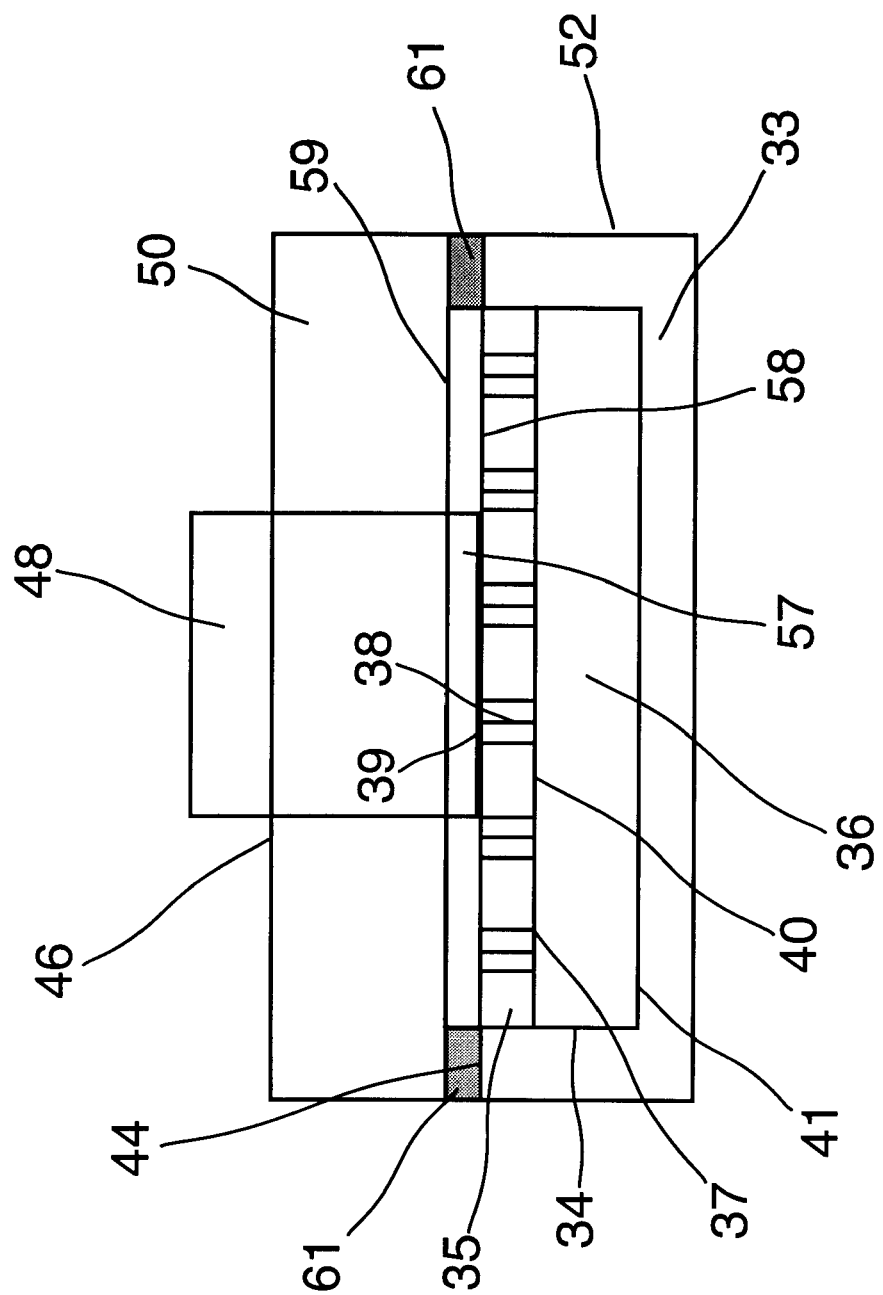
FIG. 4 is a diagrammatic end elevation cutaway view approximately opposite the view shown in FIG. 3.

As shown in FIG. 2 through FIG. 4, each pin 38 extends from upper foundation surface 40 to lower baseplate surface 58 so as to have the same "special" pin height $h_{pin}$ (wherein height $h_{pin}$ is equal to the passage depth p, or the distance between pin end 38 and upper foundation surface 40), and the same "general" or "overall" pin height H (wherein height H is equal to the distance between pin end 39 and lower foundation surface 41). Support post block foundation height $h_{sur}$, which measures the distance between planar upper foundation surface 40 and planar lower foundation surface 41, is constant.

Since every pin 38 has the same special pin height $h_{pin}$, and support post block foundation height $h_{sur}$ is constant, the overall pin height H as shown can equally be designated height H of support post block 34. It is noted that pins 38, as shown, are parallel to each other and perpendicular to both upper foundation surface 40 and lower baseplate 15 surface 58, which are parallel to each other; thus, each pin's length $l_{pin}$ equals its height $h_{pin}$.

Accordingly, support pins 38 provide mechanical support for device baseplate 57. In this regard, support pins 38 act to prevent breakage in the event of a failure of power conversion module 46. In addition, support pins 38 help the transition of fluid flow (of fluid 42) to a turbulent state, and enhance mixing to improve heat transfer from device baseplate 57.

The fluid flow system will typically include fluid flow means (e.g., including fluid pumping means), fluid inlet means and fluid outlet means. In typical inventive practice, upper foundation surface 40 of foundation 36 will define a outline shape (e.g., a rectangular shape) which provides a flow cavity constrained by the device baseplate 57 and which lends itself to provisions of the inlet flow and the outlet flow at approximately opposite sides thereof, thereby promoting uniformity of the flow in relation to the entirety of the pin 38 array; that is, the heat sink's fluid passage 66 will typically be straight (configured linearly) and be disposed transversely with respect to upper foundation surface 40, so that fluid enters at one side of upper heat sink surface 40 and exits at the opposite side thereof.

As shown in FIG. 2, cooling fluid 42 is generated pursuant to a fluid system 60 and is conveyed via inlet conduit 62 to passage inlet 64. Cooling fluid 42 enters passage inlet 64 and is channeled through fluid passage 66 (a flow cavity, e.g., a slot) so that fluid 42 contacts device baseplate 57 and flows along its lower baseplate surface 58. Fluid 42, when passing through fluid passage 66, also contacts foundation 36 and flows along its upper foundation surface 40. Fluid 42 proceeds through fluid passage. 66 and exits passage outlet 68, whereupon fluid 42 is conveyed through the outlet conduit 70. In the light of this disclosure, the ordinarily skilled artisan who seeks to practice this invention will be capable of effectuating techniques pertaining to maintenance or constancy of the flow or stream of the working fluid such as fluid 42. According to some embodiments of this invention, there are plural fluid passages 66 along with the plural passage inlets 64 and plural passage outlets 68 corresponding thereto.

Figure 5:
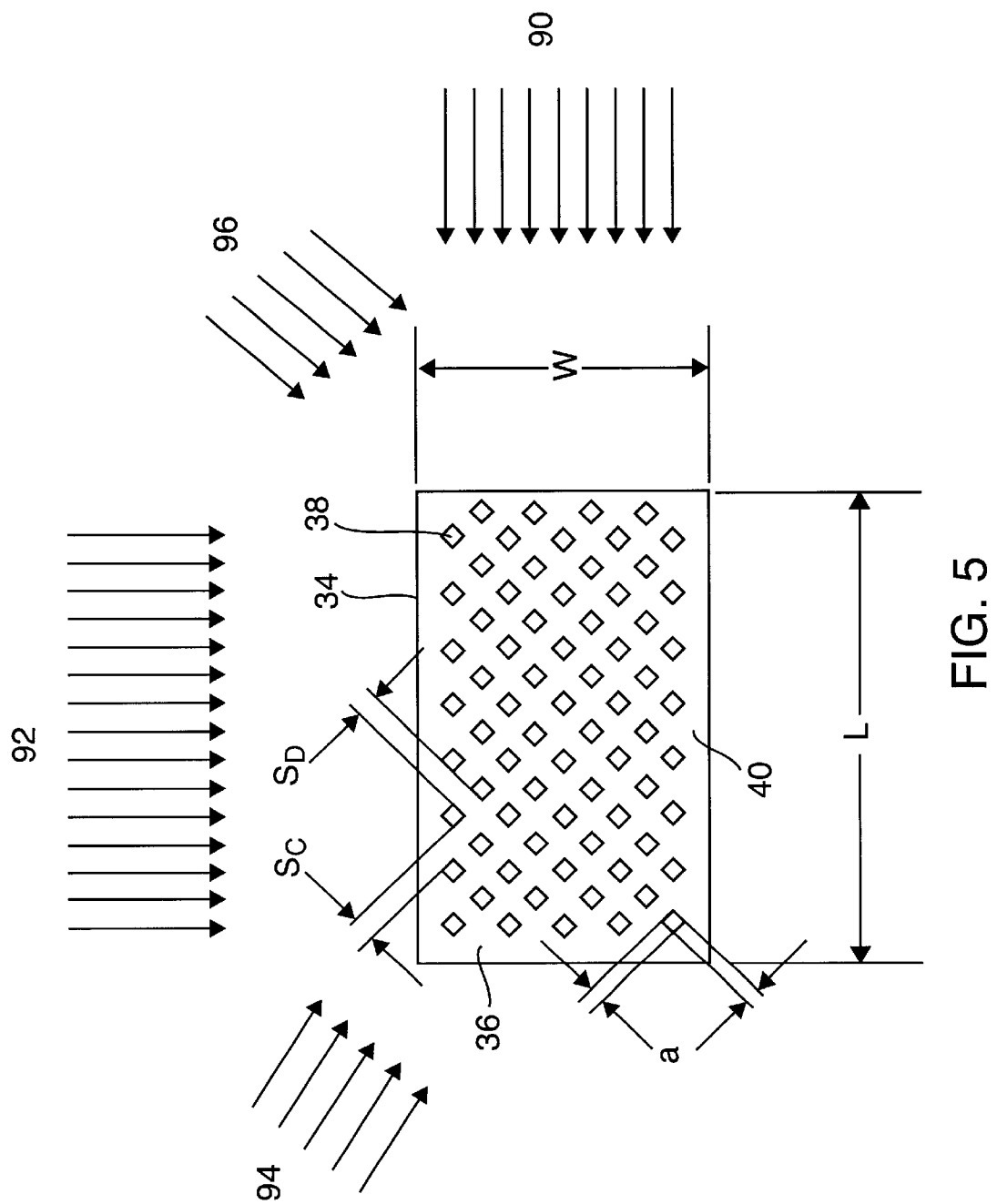
FIG. 5 is a diagrammatic top plan view of the heat sink embodiment shown in FIG. 1, wherein the turbulence-enhancing support pins are illustrated to be arrayed in staggered rows, and wherein each pin is illustrated to have approximately the same quadrilateral cross-sectional shape, more specifically a square cross-sectional shape which represents a diamond cross-sectional shape in the context of its corresponding row.
Figure 6:
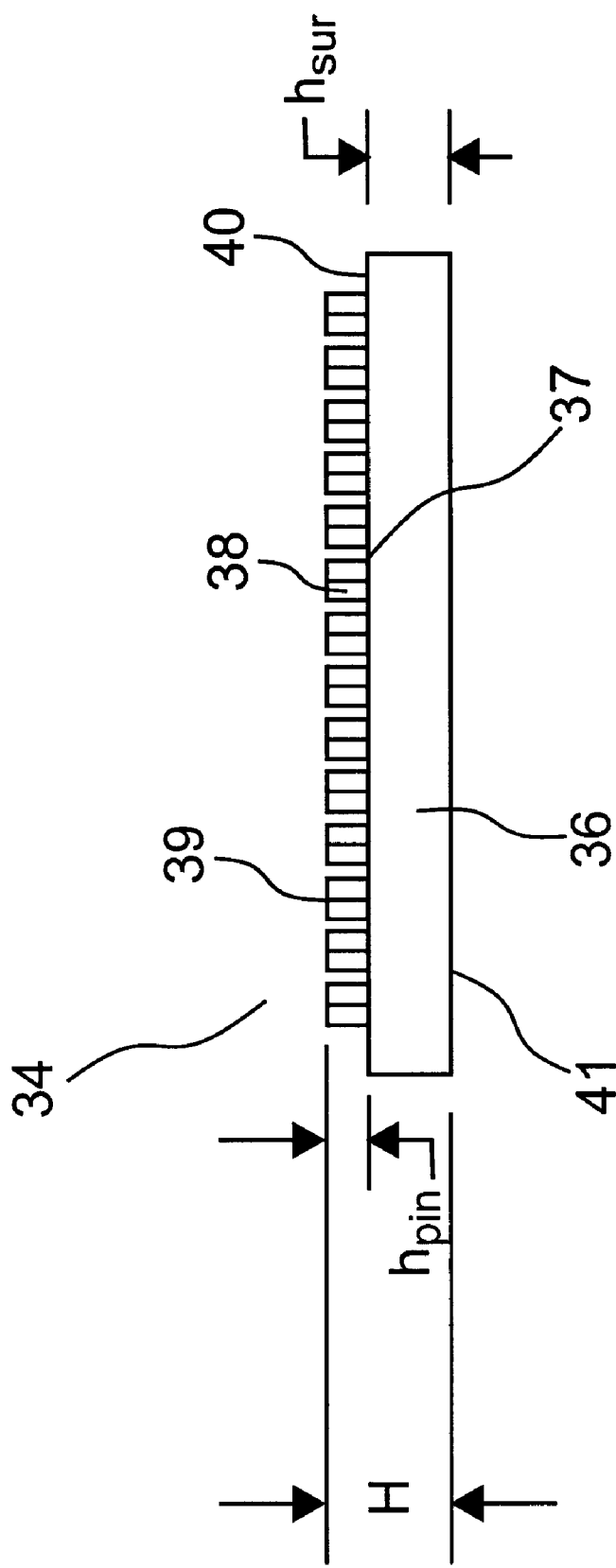
FIG. 6 is a diagrammatic side elevation view of the heat sink embodiment shown in FIG. 5.

Referring to FIG. 5 and FIG. 6, pins 38 are cross-sectionally shaped like diamonds and arranged as such in horizontal rows 90. Rows 90 are in staggered relationship with each other so that pins 38 in alternating rows 90 are vertically (columnarly) aligned. Each pin 38 is cross-sectionally square, so that each rectangular side of pin 38 has the same length/width a; that is, every pin 38 has the same thickness in either bisectional direction. According to the U.S. Navy's test prototype, cross-sectional pin length/width a=0.127 cm. Foundation section 36 was rectangular in outline shape, having a heat sink length L=5.28 cm and a heat sink width W=3.43 cm.

Upper foundation surface 40 and lower foundation surface 41 are both planar. Every pin 38 has the same special pin height $h_{pin}$ and the same general support post block 34 height H. The pin end surfaces 39 uniformly extend an overall pin height H from lower foundation surface 41. Since upper foundation surface 40 and lower foundation surface 41 are both planar, support post block foundation height $h_{sur}$ (the distance therebetween) is constant.

The pin 38 pattern shown in FIG. 5 and FIG. 6 can also be conceived to reveal cross-sectional diamond shapes arranged in vertical columns 92 so that alternating columns are horizontally (row-wise) aligned. Alternatively, the pin 38 pattern can be conceived to demonstrate diagonals 94 and cross-diagonals 96, wherein: within each diagonal 94 or cross-diagonal 96 consecutive pins 38 have adjacent rectangular sides which are parallel and abutting; diagonals 94 are perpendicular to cross-diagonals 96; and, diagonals 94 and cross-diagonals 96 are each disposed at a forty-five degree angle with respect to length L and width W. The diagonal spacing $S_D$ between pins 38 is shown to equal the cross-diagonal spacing $S_C$ between pins 38. According to the U.S. Navy's test prototype, diagonal spacing $S_D$=cross-diagonal spacing $S_D$=0.381 cm.

Figure 7:
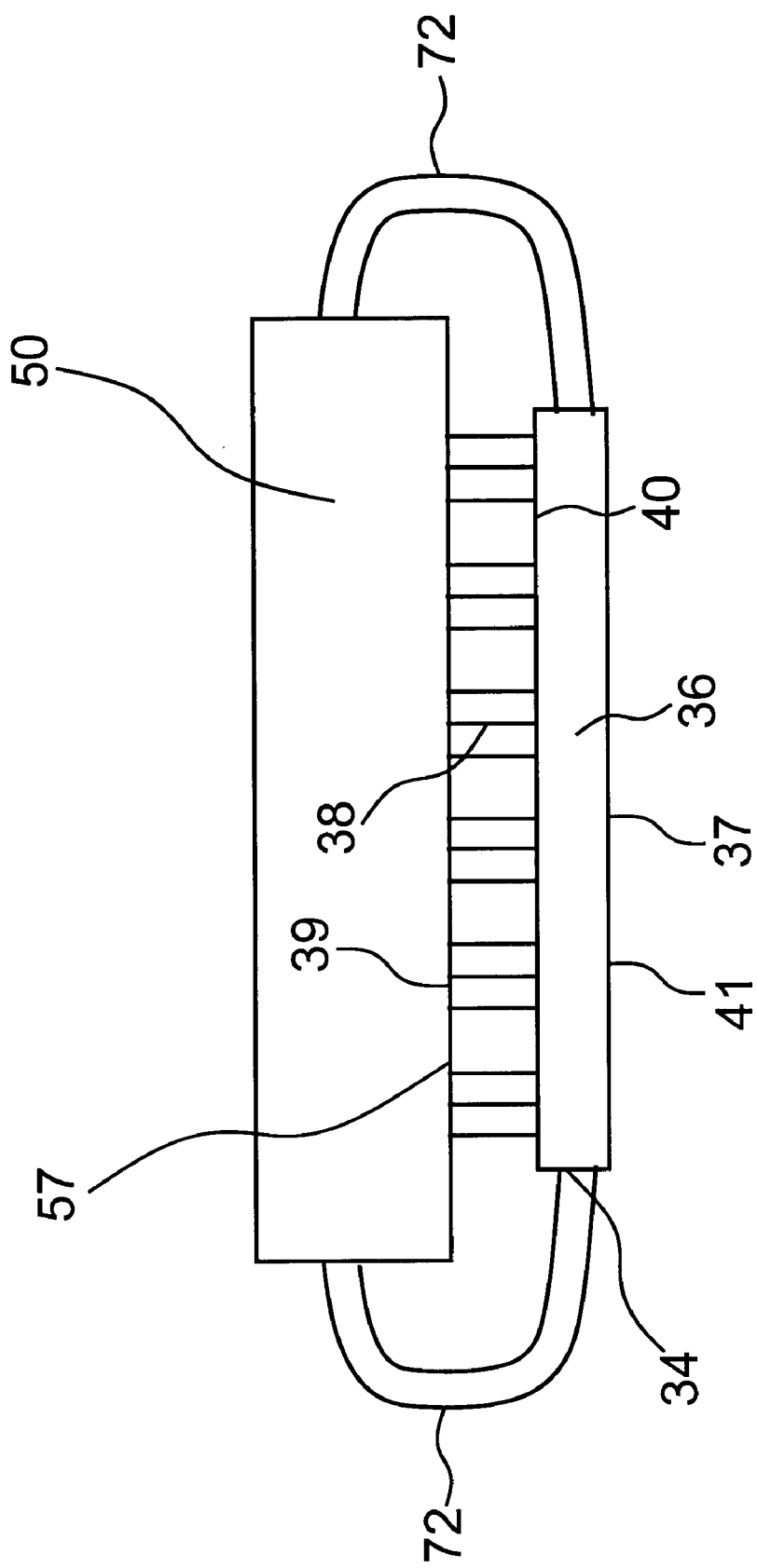
FIG. 7 is a diagrammatic side elevation view, similar to the view shown in FIG. 2, and sans manifold housing.

FIG. 1 through FIG. 6 basically depict the U.S. Navy's original inventive design. With reference to FIG. 7, some inventive embodiments similarly provide for engagement of pins 38 (more specifically, pin ends 39) with lower baseplate surface 58, but in the absence of an enclosure-type housing providing inlet and outlet access, such as manifold 33. For instance, device baseplate 57 and support post block 34 can be detachably or more permanently attached, e.g., adhesively or using auxiliary apparatus such as a pair of passage-accessabilizing brackets 72, one of which accommodates fluid inlet and the other of which accommodates fluid outlet, such as shown in FIG. 7.

The present invention admits of a diversity of embodiments. As elaborated upon hereinbelow, the inventive practitioner can vary one or more dimensional, configurational and/or geometric parameters, including but not limited to the following: (i) pin length and/or height; (ii) pin cross-sectional shape (e.g., circular versus triangular versus square, etc.); (iii) pin distribution (e.g., non-staggered rows versus staggered rows, angularity of row staggering, even or parallel row orientations versus offset row orientations, angularity of row orientation offset, etc.); (iv) pin spacing (e.g., distances between various pins in various directions); (v) passage depth (e.g., distance between modular baseplate and heat sink base section); (vi) passage shape (e.g., relative dispositions of modular baseplate and heat sink base section, contour (three-dimensional shape) of modular baseplate, contour (three-dimensional shape) of heat sink base section, etc.); (vii) heat sink base section's outline (two-dimensional) shape; (viii) heat sink base section's transverse dimensions; (ix) fluid inlet configuration; and, (x) fluid outlet configuration.

FIG. 1 through FIG. 7 essentially portray the original pin-and-base geometric scheme, as tested by the U.S. Navy. Reference now being made to FIG. 8 through FIG. 31, the present invention provides for multifarious alternatives with respect to the sizes, shapes, locations and spatial relationships characterizing pins 38 and foundation 36. It is emphasized that inventive practice is not limited to the geometric modalities represented herein in the drawings. The geometric modalities shown in these figures are intended herein to be "generic" in nature because dissimilar geometric motifs can manifest similar principles and concepts; in particular, different geometries and forms of the pins and/or the base section can be used to generate attributes of mechanical support and/or thermal performance. It will be apparent to the ordinarily skilled artisan who reads this disclosure that there are thematic commonalities among the diverse geometric modalities specifically disclosed herein, and that many geometric modalities not specifically disclosed herein can be inventively practiced in accordance with such thematic commonalities and in accordance with other inventive principles disclosed herein.

Figure 8:
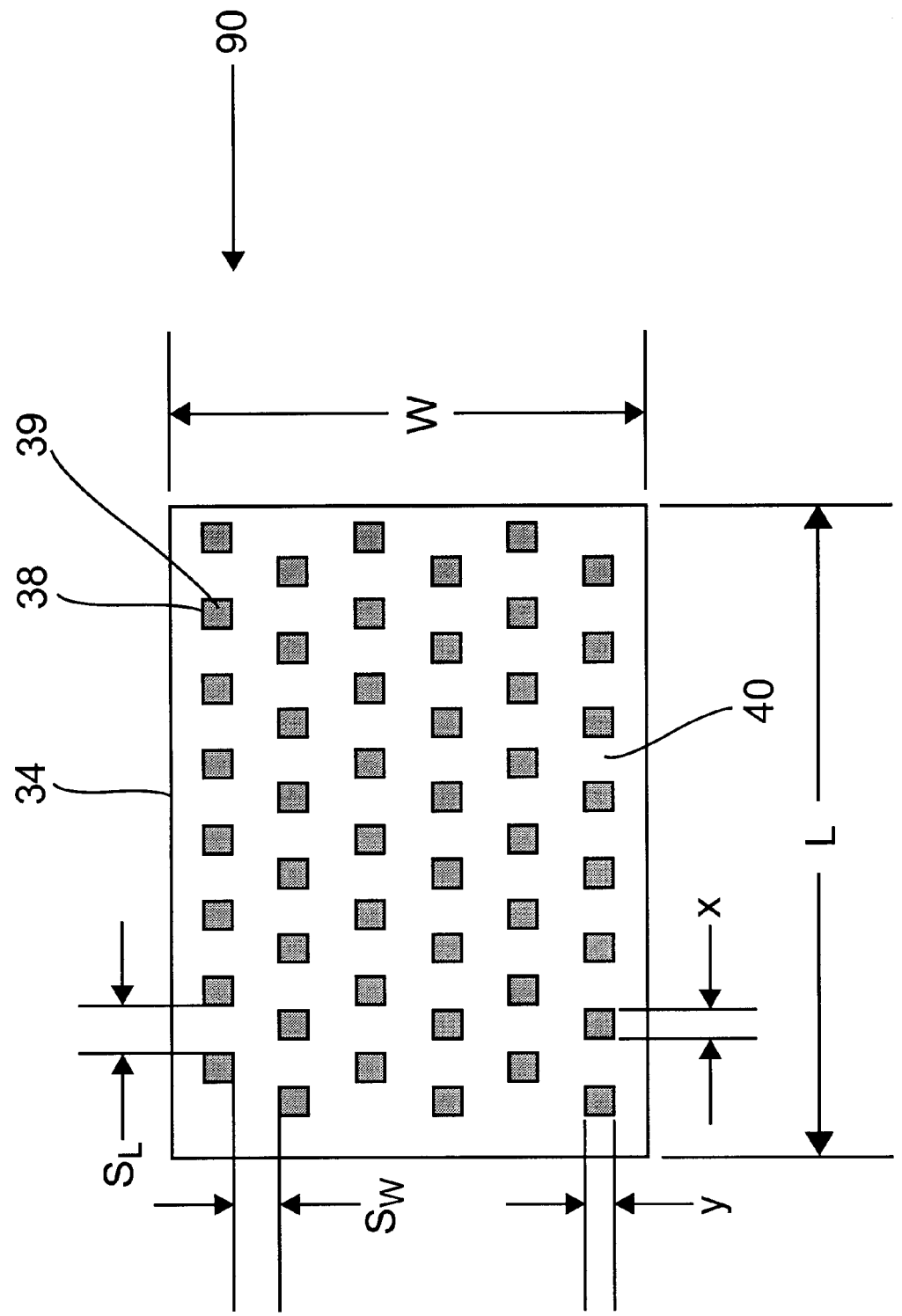
FIG. 8 is a diagrammatic top plan view of another inventive embodiment of a heat sink device, wherein the turbulence-enhancing support pins are illustrated to be arrayed in staggered rows, and wherein each pin is illustrated to have approximately the same quadrilateral cross-sectional shape which represents a rectangular cross-sectional shape, more specifically a non-square rectangular cross-sectional shape, in the context of its corresponding row.
Figure 9:
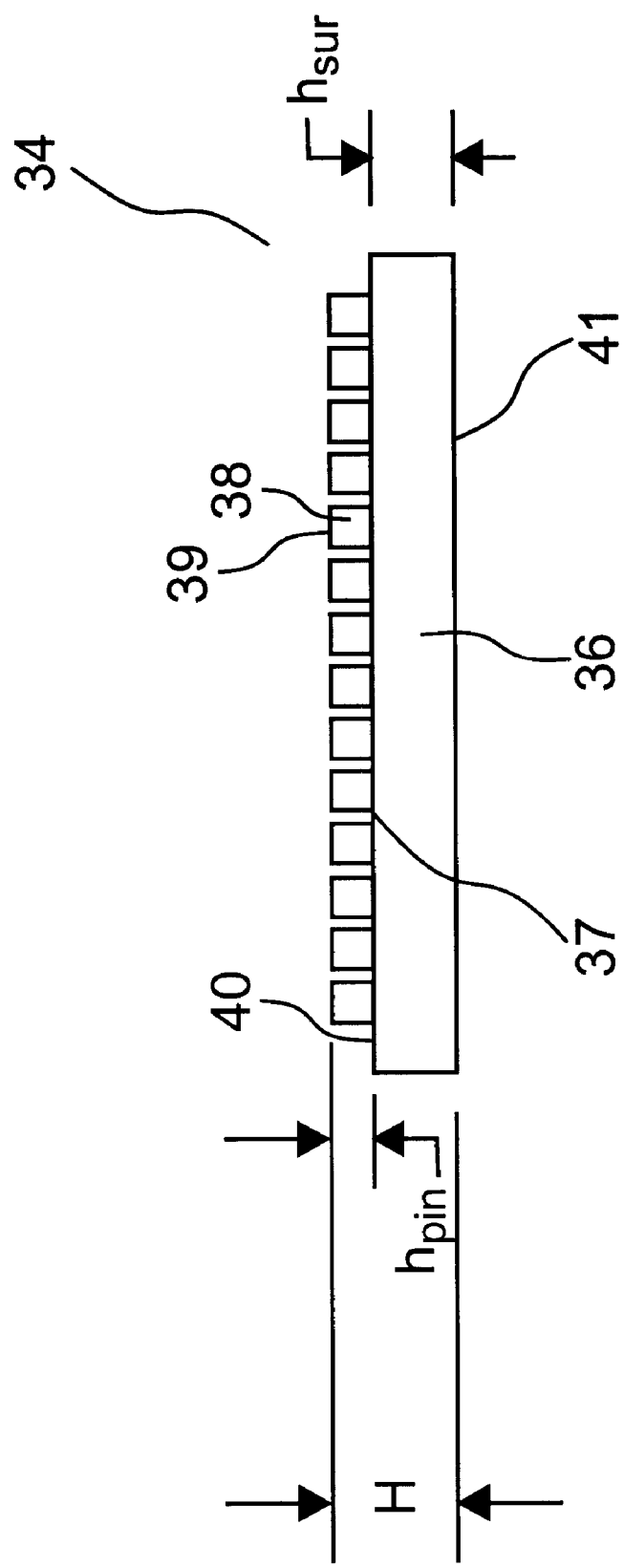
FIG. 9 is a diagrammatic side elevation view of the heat sink embodiment shown in FIG. 8.

FIG. 8 and FIG. 9 illustrate an array of pins 38 each having a rectangular pin cross-section. Each pin 38 has a cross-sectional pin length x and a cross-sectional pin width y. The lengthwise pin spacing (distance between two consecutive pins in the lengthwise direction, i.e., within a given row 90) is represented as $S_L$, and the widthwise pin spacing (distance between two consecutive rows 90 or pins 38 in the widthwise direction) is represented as $S_W$. Similarly as shown in FIG. 5 and FIG. 6, rows 90 are in staggered relationship with each other so that pins 38 in alternating rows 90 are vertically (columnarly) aligned. As distinguished from FIG. 5 and FIG. 6, the pins 38 are rectangular as aligned within each row 90; hence, within each row 90, consecutive pins 38 have adjacent rectangular sides which are parallel and abutting.

Figure 10:
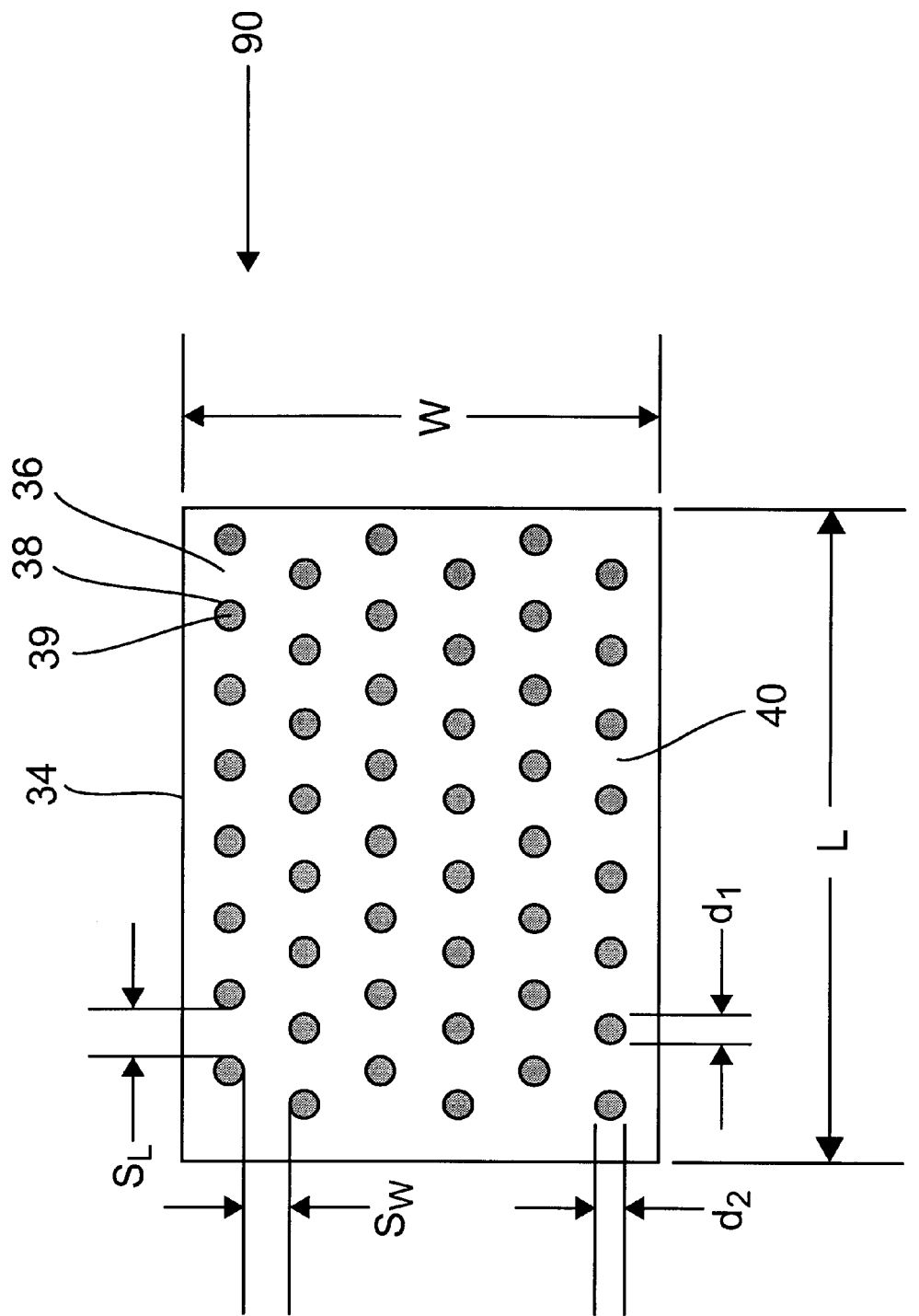
FIG. 10 is a diagrammatic top plan view of another inventive embodiment of a heat sink device, wherein the turbulence-enhancing support pins are illustrated to be arrayed in staggered rows, and wherein each pin is illustrated to have approximately the elliptical cross-sectional shape.
Figure 11:
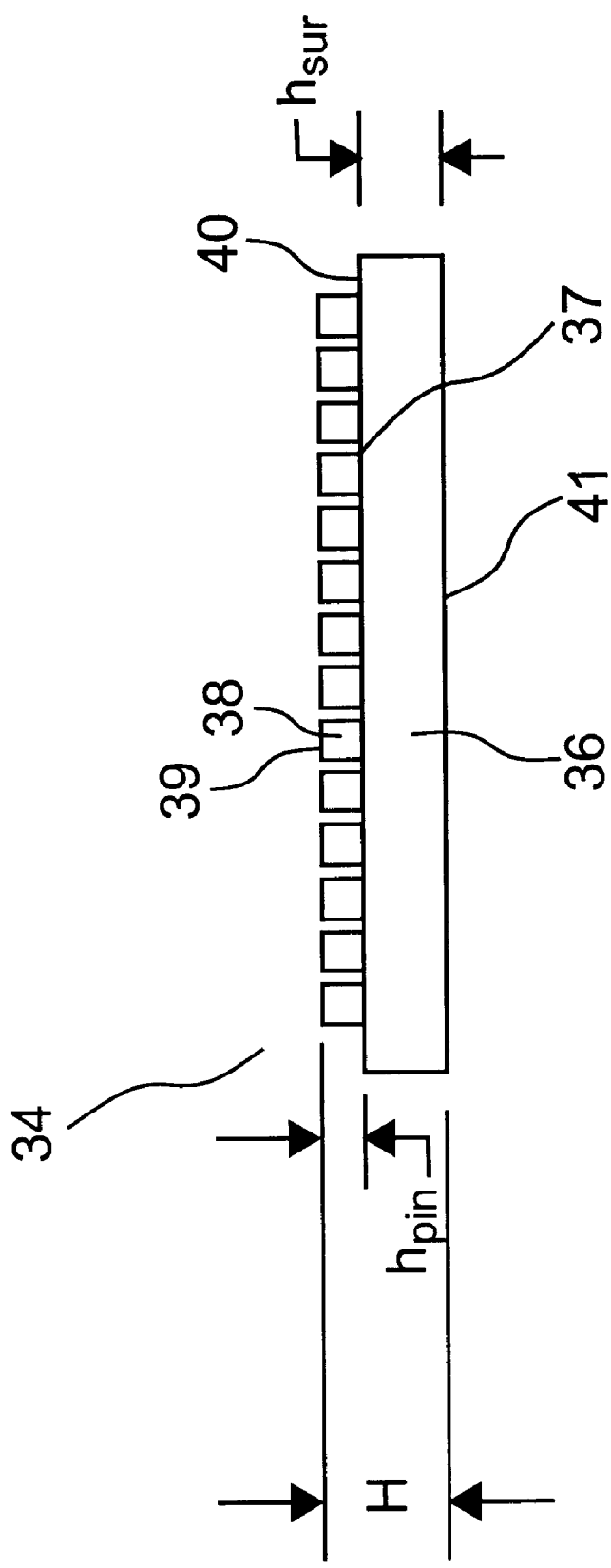
FIG. 11 is a diagrammatic side elevation view of the heat sink embodiment shown in FIG. 10.

FIG. 10 and FIG. 11 similarly show a staggered relationship among rows 90 wherein pins 38 of alternating rows 90 are vertically (columnarly) aligned. Unlike pins 38 shown in FIG. 5 through FIG. 9, pins 38 shown in FIG. 10 and FIG. 11 are elliptical in cross-section. Here each pin 38 ellipse is characterized by a short diameter $d_1$ and a long diameter $d_2$. If $d_1$ and $d_2$ are equal, then a circular cross-section results. The pin 38 array is characterized by lengthwise pin spacing $S_L$ and widthwise pin spacing $S_W$. Each pin has the same special pin height $h_{pin}$ and the same total support post block pin height H.

Figure 12:
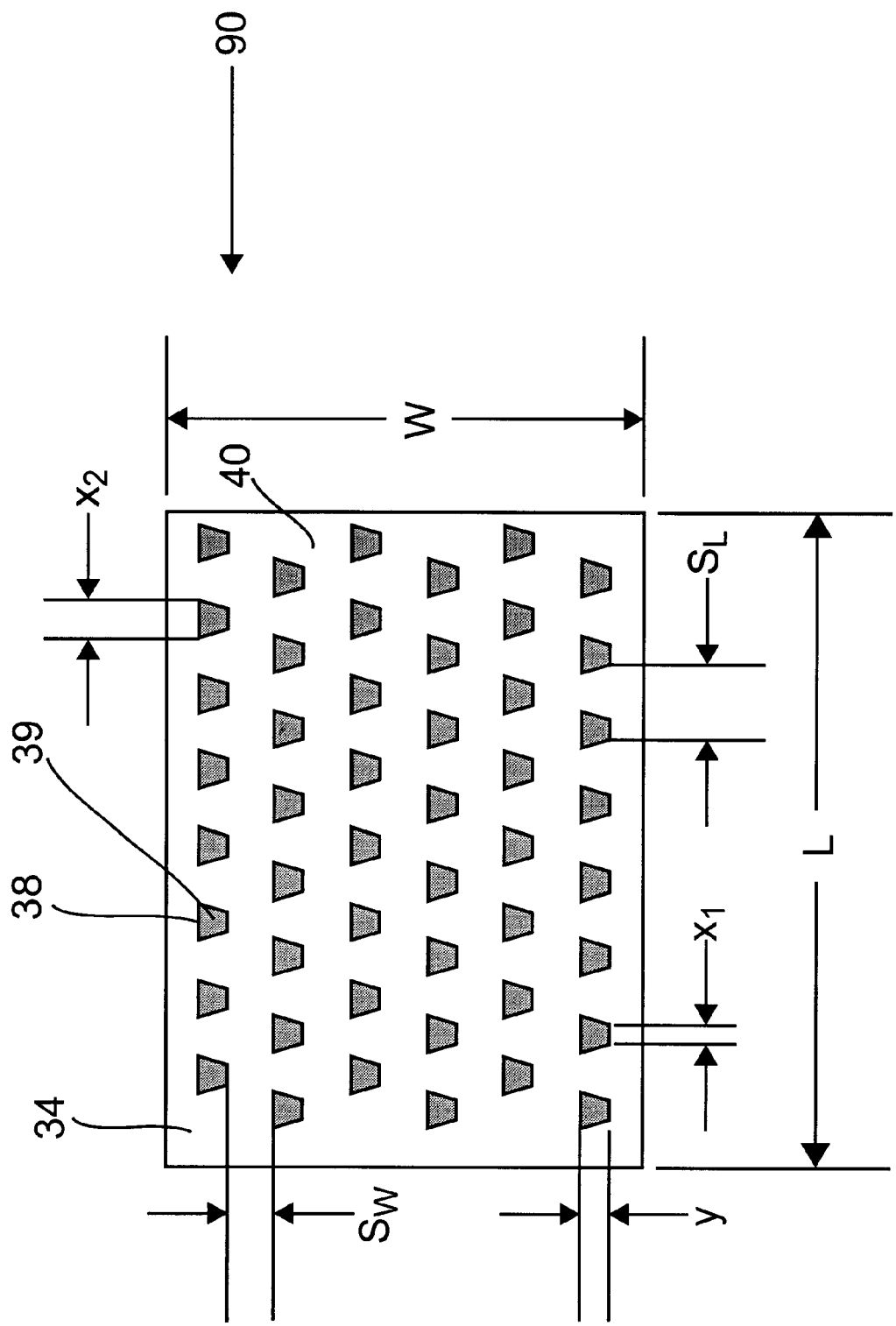
FIG. 12 is a diagrammatic top plan view of another inventive embodiment of a heat sink device, wherein the turbulence-enhancing support pins are illustrated to be arrayed in staggered rows, and wherein each pin is illustrated to have approximately the same non-rectangular cross-sectional shape, more specifically a trapezoidal cross-sectional shape.
Figure 13:
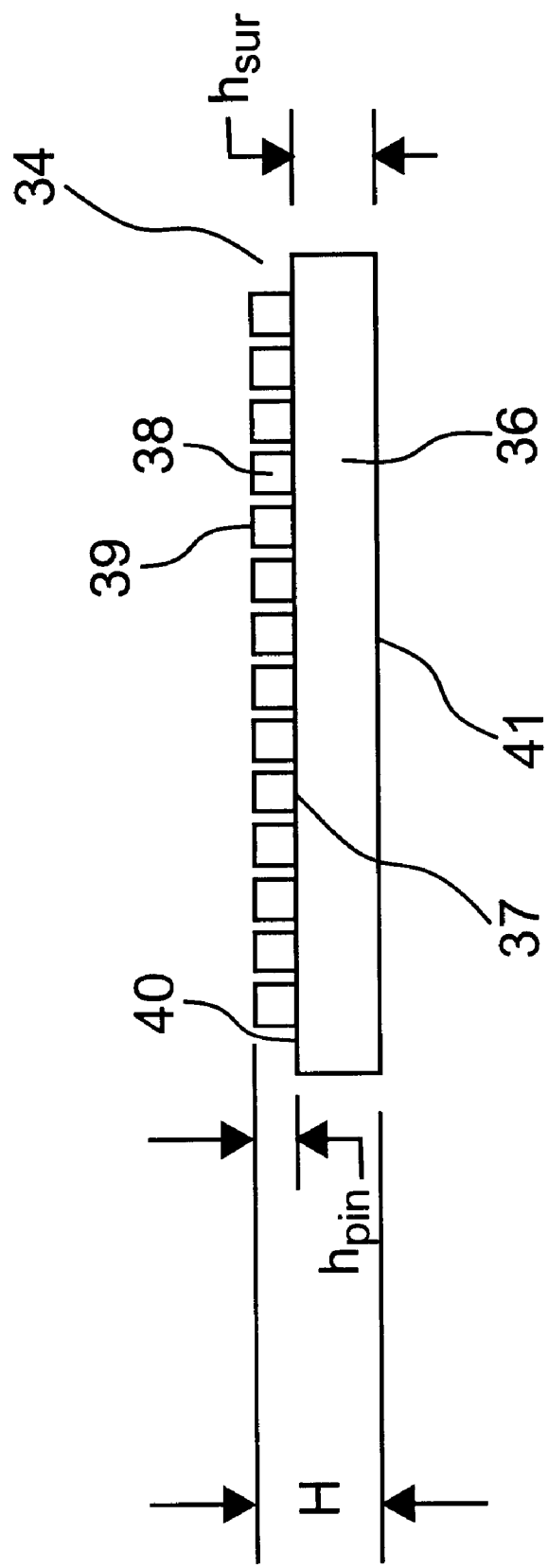
FIG. 13 is a diagrammatic side elevation view of the heat sink embodiment shown in FIG. 12.

FIG. 12 and FIG. 13 represent a quadrilateral cross-section of pins 38 which is not rectangular. Each pin 38 trapezoid is characterized by two unequal parallel sides, one having a length $x_1$ and the other having a length $x_2$, wherein the distance therebetween is trapezoidal height y. Length $x_1$ can be greater than, less than or equal to length $X_2$. If $x_1=x_2$, then a rectangular cross-section such as shown in FIG. 8 results. Again, each pin has an equal pin height $h_{pin}$ and an equal total support post block height H, and the pin 38 array is characterized by lengthwise pin spacing $S_L$ and widthwise pin spacing $S_W$. Although a regular trapezoid pin 38 shape is shown, it can be considered that other four-sided pin 38 shapes can be inventively practiced, e.g., square, diamond, rectangle, rhombus, parallelogram, irregular or nondescript quadrilateral, etc. According to this invention, the triangular support pins 38 need not be equilateral, but can be characterized by any shape triangle.

Figure 14:
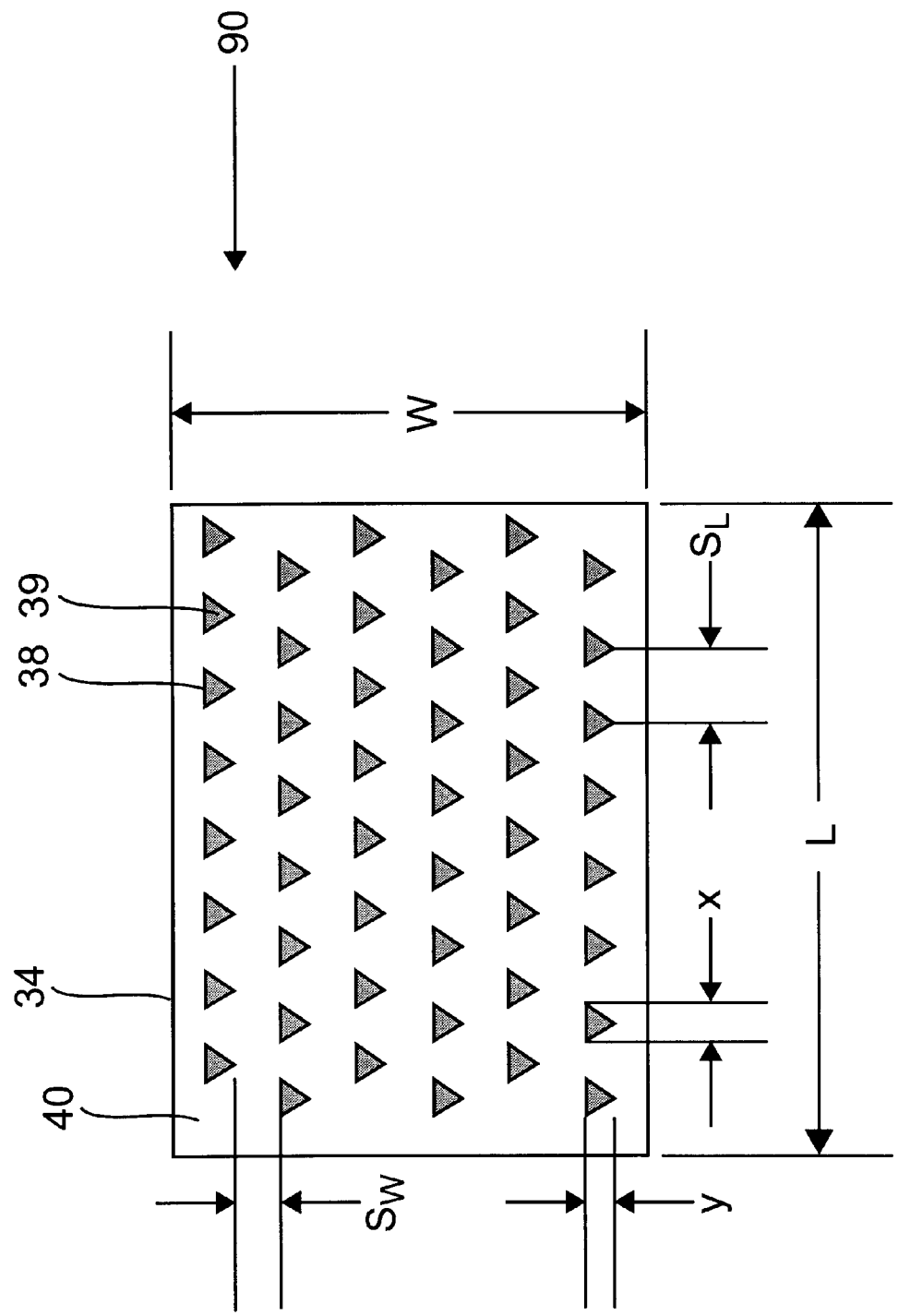
FIG. 14 is a diagrammatic top plan view of another inventive embodiment of a heat sink device, wherein the turbulence-enhancing support pins are illustrated to be arrayed in staggered rows, and wherein each pin is illustrated to have approximately the same triangular cross-sectional shape.
Figure 15:
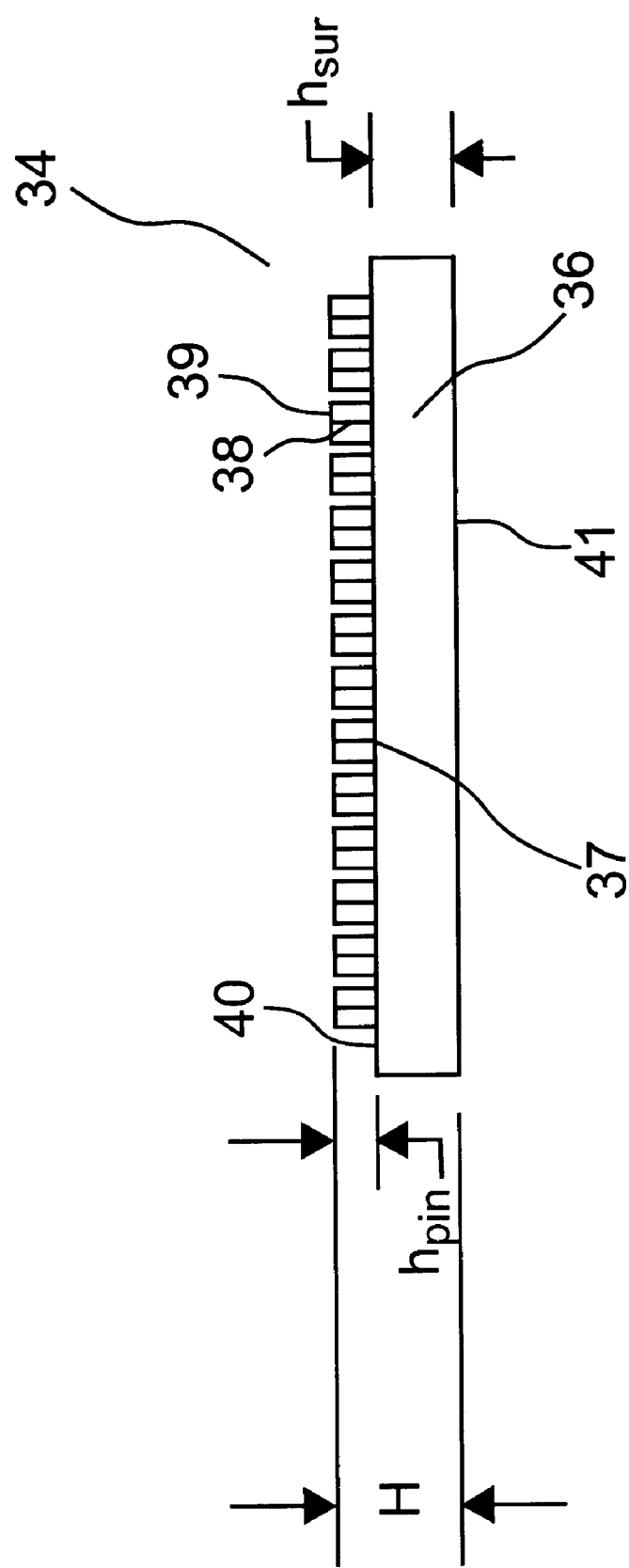
FIG. 15 is a diagrammatic side elevation view of the heat sink embodiment shown in FIG. 14.

FIG. 14 and FIG. 15 represent a triangular cross-section of pins 38. As shown, the triangles are equilateral (and hence equiangular) and inverted. Each pin 38 triangle is characterized by three equal sides x, wherein the distance between two sides is triangular height (or triangular bisector) y. Lengthwise pin spacing $S_L$ is the distance between rows 90, and widthwise pin spacing $S_W$ is the distance between the corresponding vertices of two adjacent pin 38 triangles.

Figure 16:
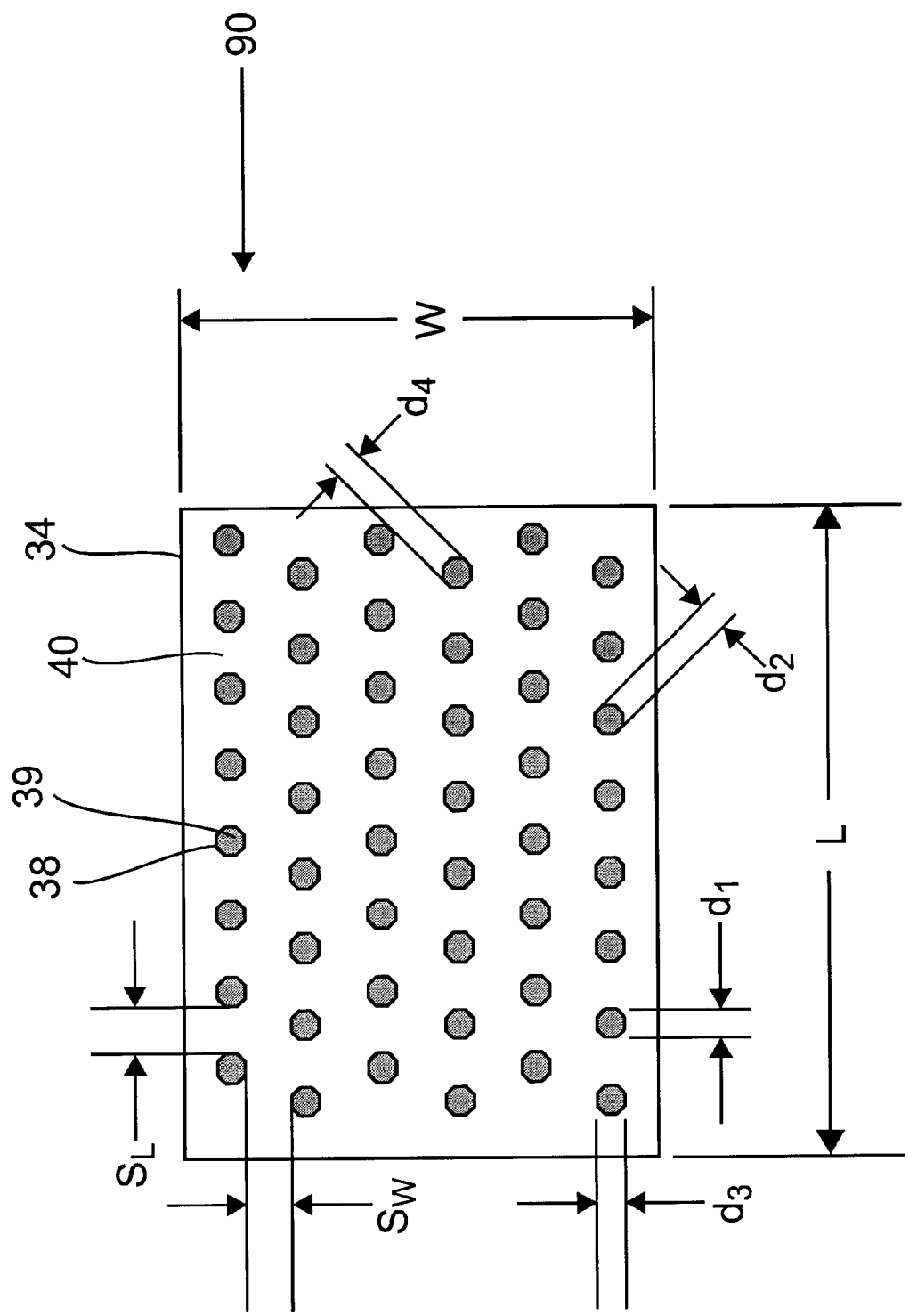
FIG. 16 is a diagrammatic top plan view of another inventive embodiment of a heat sink device, wherein the turbulence-enhancing support pins are illustrated to be arrayed in staggered rows, and wherein each pin is illustrated to have approximately the same at least five-sided geometric (e.g., polygonal) cross-sectional shape, more specifically an octogonal cross-sectional shape.
Figure 17:
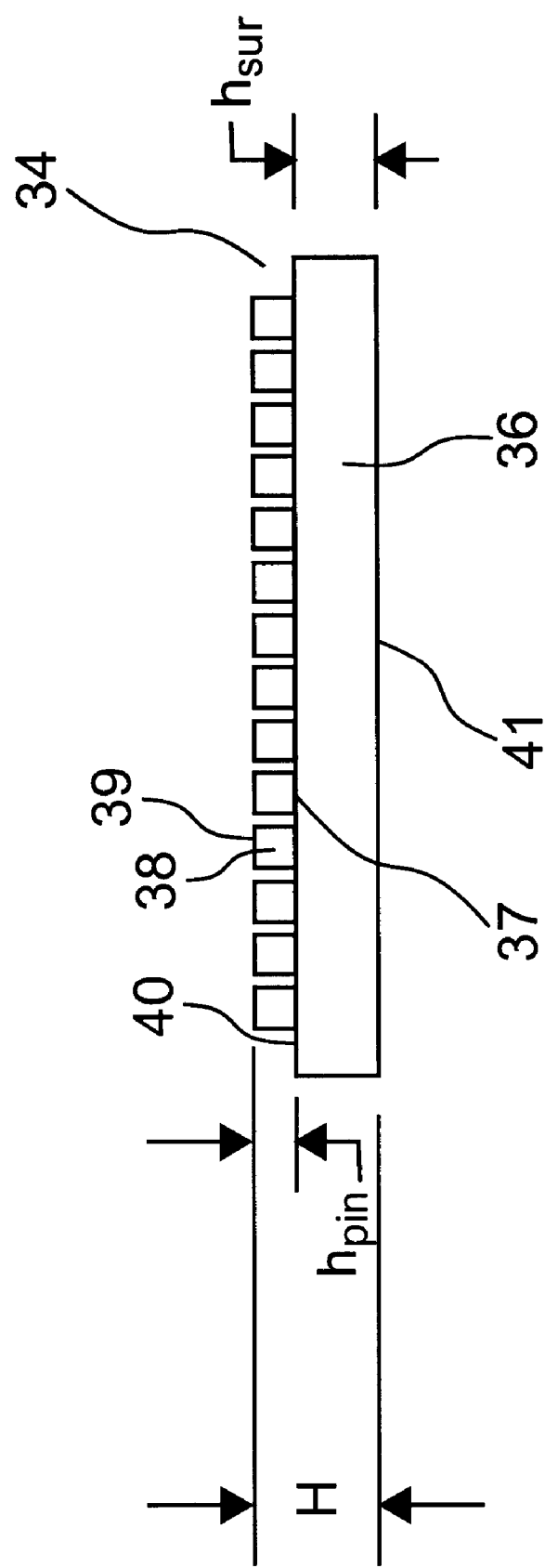
FIG. 17 is a diagrammatic side elevation view of the heat sink embodiment shown in FIG. 16.

FIG. 16 and FIG. 17 show an octagonal cross-section of pins 38. Each pin 38 octagon has four pairs of equal, opposite sides; the first pair has length $d_1$, the second pair has length $d_2$, the third pair has length $d_3$, and the fourth pair has length $d_4$. FIG. 16 and FIG. 17 can be considered to demonstrate that not only triangular and quadrilateral geometric pin 38 shapes, but also any among a diversity of multiple-sided geometric (polygonal) pin 38 shapes, can be inventively practiced—e.g., pentagonal (five-sided), hexagonal (six-sided), septagonal (seven-sided), octagonal (eight-sided), nonogonal (nine-sided), decagonal (ten-sided), etc. Each polygonal side can be equal in length (thus rendering the polygon "regular"), or two or more polygonal sides can be unequal in length (thus rendering the polygon "irregular"). Moreover, one or more vertex angles formed by two adjacent polygonal sides can be "exterior" rather than "interior"; for instance, a ten-sided figure having alternating interior and exterior angles describes a five-pointed star shape.

Again, analogously as shown in FIG. 5 through FIG. 11, in FIG. 12 through FIG. 17 the pins 38 in every row 90 are staggered with respect to the pins 38 in the adjacent row or rows 90, so that pins 38 in every other row 90 are vertically (columnarly) aligned.

Figure 18:
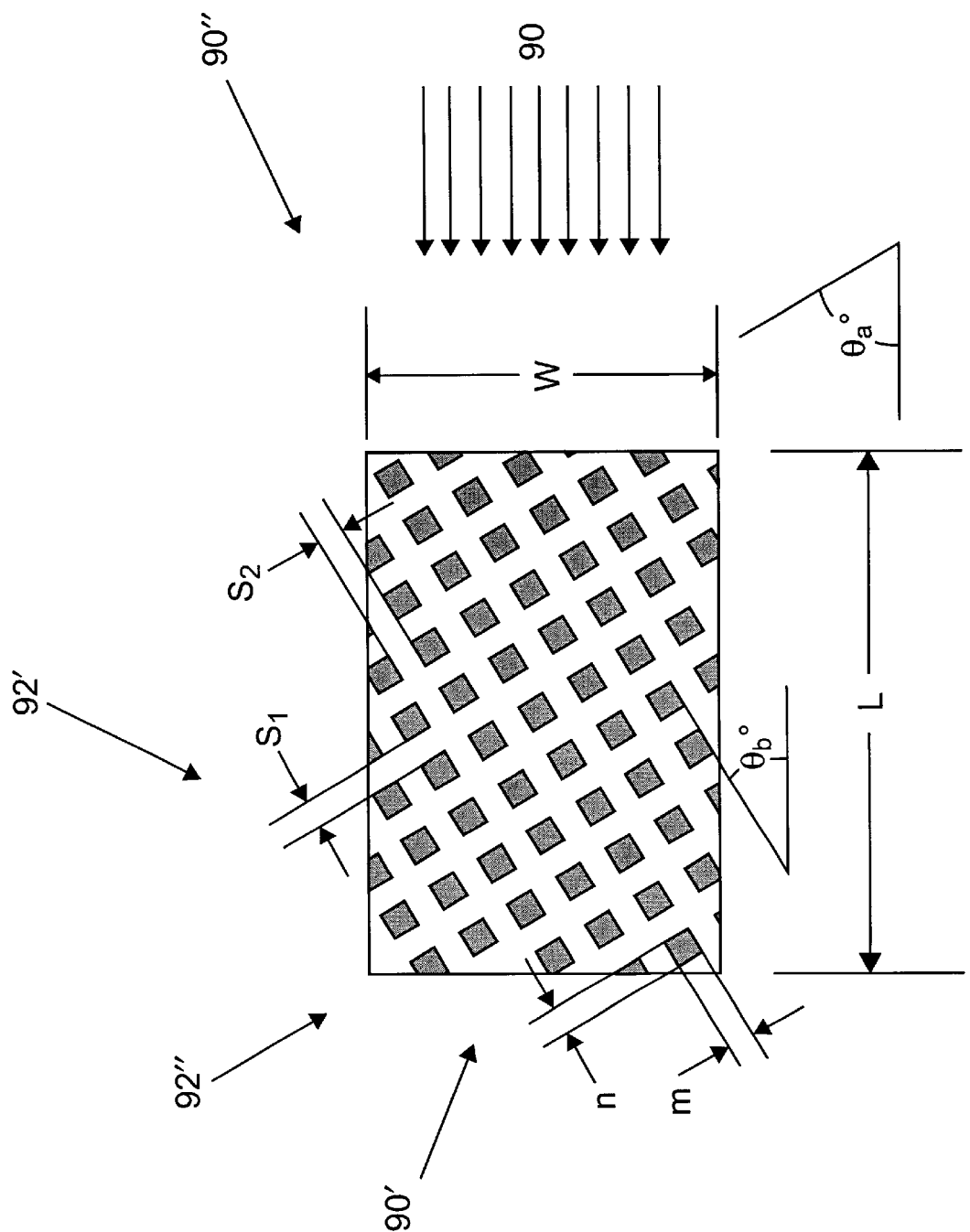
FIG. 18 is a diagrammatic top plan view of another inventive embodiment of a heat sink device, wherein the turbulence-enhancing support pins are illustrated to be arrayed in non-staggered rows, wherein each pin is illustrated to have approximately the same square cross-sectional shape, and wherein is generically illustrated a longitudinally offset angularity of the rows.
Figure 19:
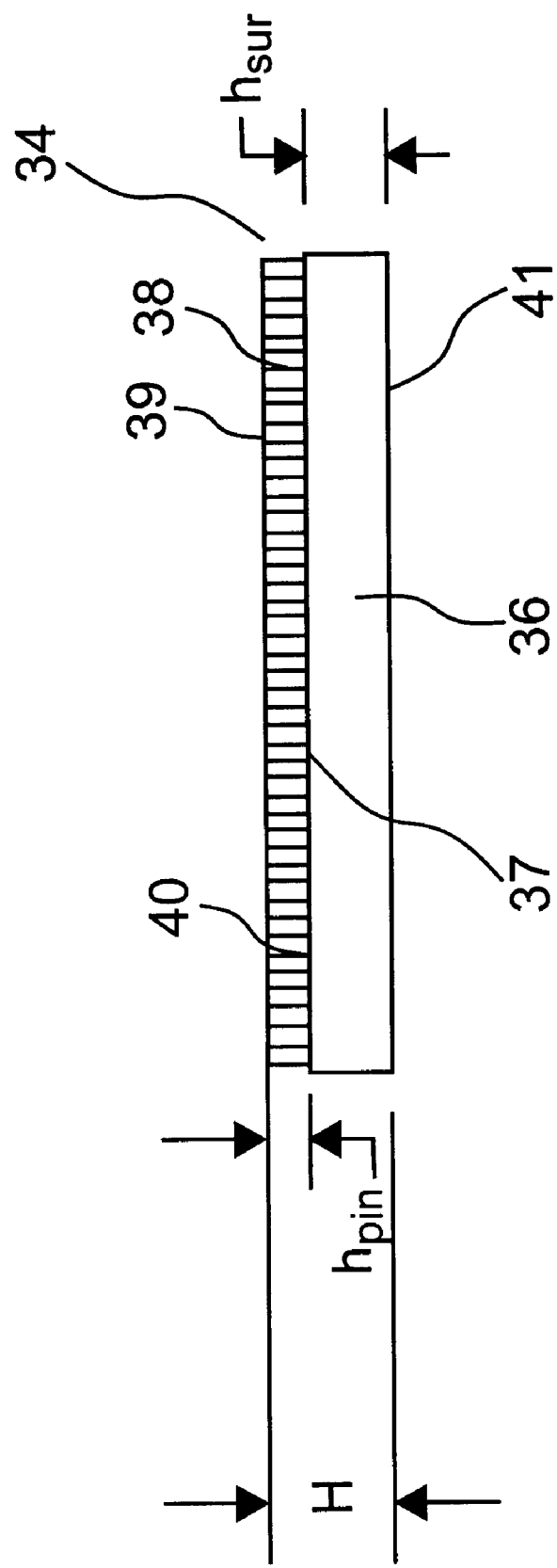
FIG. 19 is a diagrammatic side elevation view of the heat sink embodiment shown in FIG. 18.

Reference now being made to FIG. 18 and FIG. 19, pins 38 are aligned in rows similarly as shown in FIG. 5 through FIG. 17; however, here the rows are non-horizontally (obliquely) oriented. It can be considered that the pin 38 array shown in FIG. 18 and FIG. 19 represents an angularly offset variation of the pin 38 array shown in FIG. 5 and FIG. 6. It is recalled that the pin 38 array shown in FIG. 5 and FIG. 6 can be thought of in various ways—for instance, considered to illustrate cross-sectional diamond shapes arranged in horizontal rows 90 so that alternating columns are vertically aligned, or considered to illustrate diagonals 94 and cross-diagonals 96 of square shapes which are orthogonal in relation to each other and at forty-five degree angles in relation to the heat sink length L. By comparison, the pin 38 array shown in FIG. 18 and FIG. 19 can be considered to illustrate cross-sectional diamond shapes arranged, in staggered fashion, in negatively sloped oblique rows 90' (at angle $\theta_a$ with respect to heat sink length L) and positively sloped oblique columns 92' which are at right angles to rows 90'.

Or, the pin 38 array shown in FIG. 18 and FIG. 19 can be considered to illustrate cross-sectional rectangular shapes arranged, in non-staggered fashion, in positively sloped oblique rows 90" (at angle $\theta_b$ with respect to heat sink length L) and negatively sloped oblique columns 92" which are at right angles to rows 90", wherein lengthwise pin spacing $S_L$" is the distance between adjacent oblique rows 90", and wherein widthwise pin spacing $S_W$" is the distance between adjacent oblique columns 92".

Although rectangularly-shaped pin 38 cross-sections (having cross-sectional pin length m and cross-sectional pin width n) are portrayed in FIG. 18 and FIG. 19, it is readily appreciated by the ordinarily skilled reader of this disclosure that pin 38 cross-sections of any shape can be disposed either in angularly offset fashion (e.g., oblique with respect to a selected longitudinal line, such as an edge of the upper foundation surface 40) or in angularly non-offset fashion (e.g., parallel with respect to a selected longitudinal line, such as an edge of the upper foundation surface 40). FIG. 18 and FIG. 19 are merely exemplary insofar as generically demonstrating that inventive practice can use any combination of geometrical cross-sectional shapes, geometrical arrangements and angularities with respect to a longitude (e.g., angle θ can be any value greater than or equal to zero). In fact, the present invention encompasses a potentially infinite number of variations of cross-sectional shapes and locations of pins 38.

Figure 20:
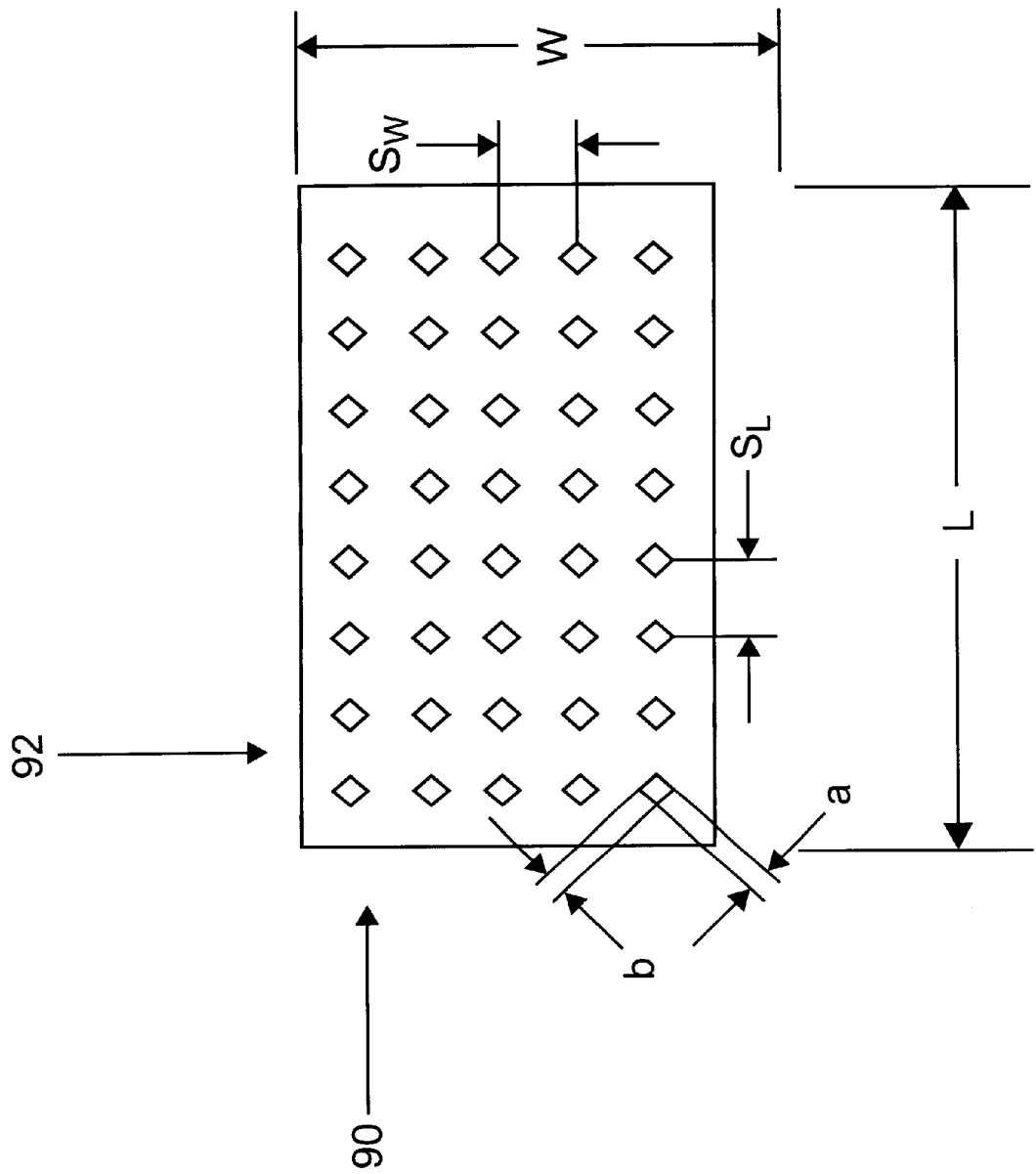
FIG. 20 is a diagrammatic top plan view of another inventive embodiment of a heat sink device, wherein the turbulence-enhancing support pins are illustrated to be arrayed in non-staggered rows, and wherein each pin is illustrated to have approximately the same square cross-sectional shape which represents a diamond cross-sectional shape in the context of its corresponding row.
Figure 21:
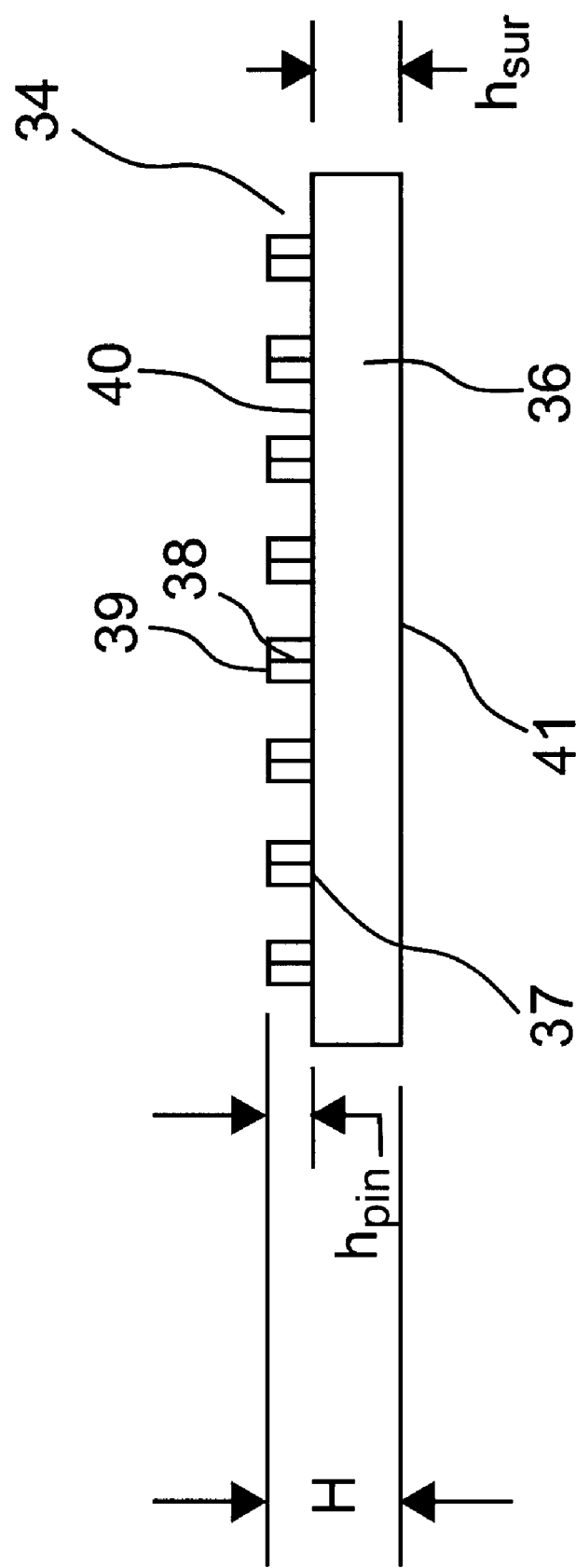
FIG. 21 is a diagrammatic side elevation view of the heat sink embodiment shown in FIG. 20.

FIG. 20 and FIG. 21 depict an array of pins 38 wherein each has a diamond post geometry. These pins 38 are analogous to those shown in FIG. 5 and FIG. 6 insofar as having a diamond post geometry. The two pin 38 arrays are distinguishable insofar as that shown in FIG. 5 and FIG. 6 is staggered, whereas that shown in FIG. 20 and FIG. 21 is not staggered. In addition to being both horizontally and vertically aligned, the pin 38 distribution shown in FIG. 20 and FIG. 21 is characterized by a sort of homogeneity or uniformity, since all pins 38 are equidistant in both the horizontal (indicated by lengthwise pin spacings $S_L$) and vertical (indicated by widthwise pin spacings $S_W$) directions. In other words, every pair of pins 38 in a row 90 has the same lengthwise pin spacing $S_L$ (taken as the distance between corresponding rectangular vertices), every pair of pins 38 in a column 92 has the same widthwise pin spacing $S_W$ (taken as the distance between corresponding rectangular vertices), and all values of lengthwise pin spacing $S_L$ and widthwise pin spacing $S_W$ are equal.

It is again emphasized that any number or geometric arrangement of support pins 38 can be used in inventive practice. With regard to the properties of staggeredness and uniformity (homogeneity), an inventive pin 38 array can be characterized by staggered uniformity, non-staggered uniformity, staggered nonuniformity or non-staggered non-uniformity. Further, any combination of two or more geometric pin 38 shapes can be used for a given pin 38 array.

Figure 22:
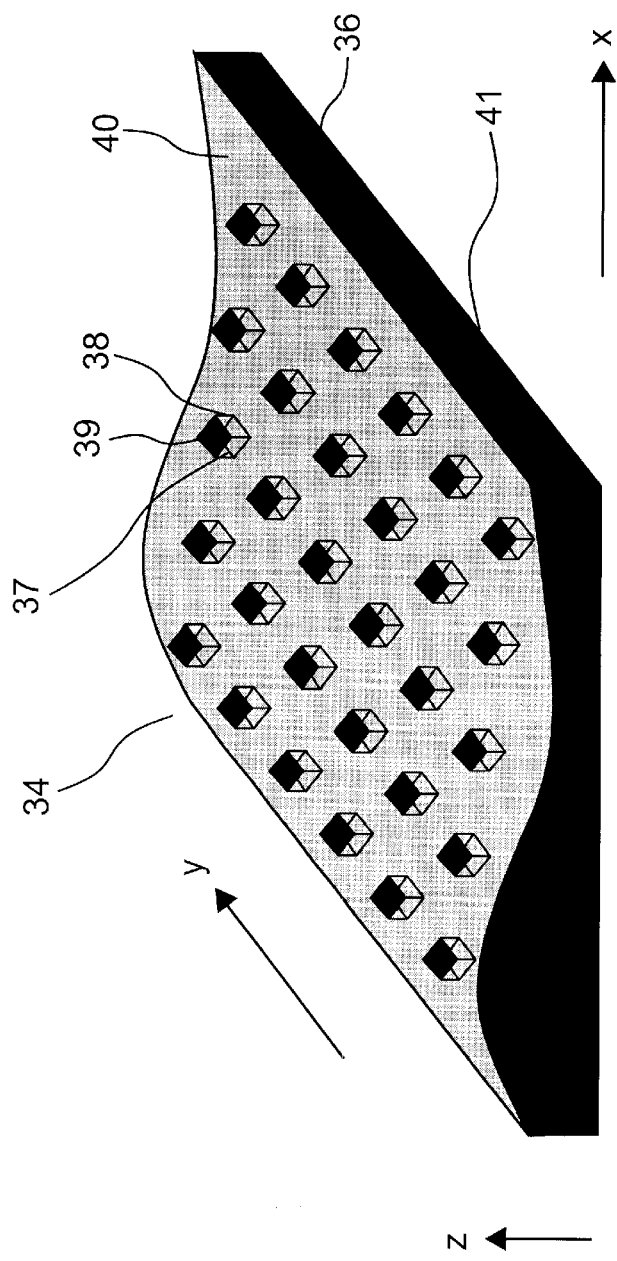
FIG. 22 is a diagrammatic perspective view of an inventive heat sink embodiment wherein the turbulence-enhancing support pins are illustrated to be arrayed in non-staggered rows, wherein each pin is illustrated to have approximately the same square cross-sectional shape, and wherein the pins are illustrated to project from a non-planar (curved) base surface.
Figure 23:
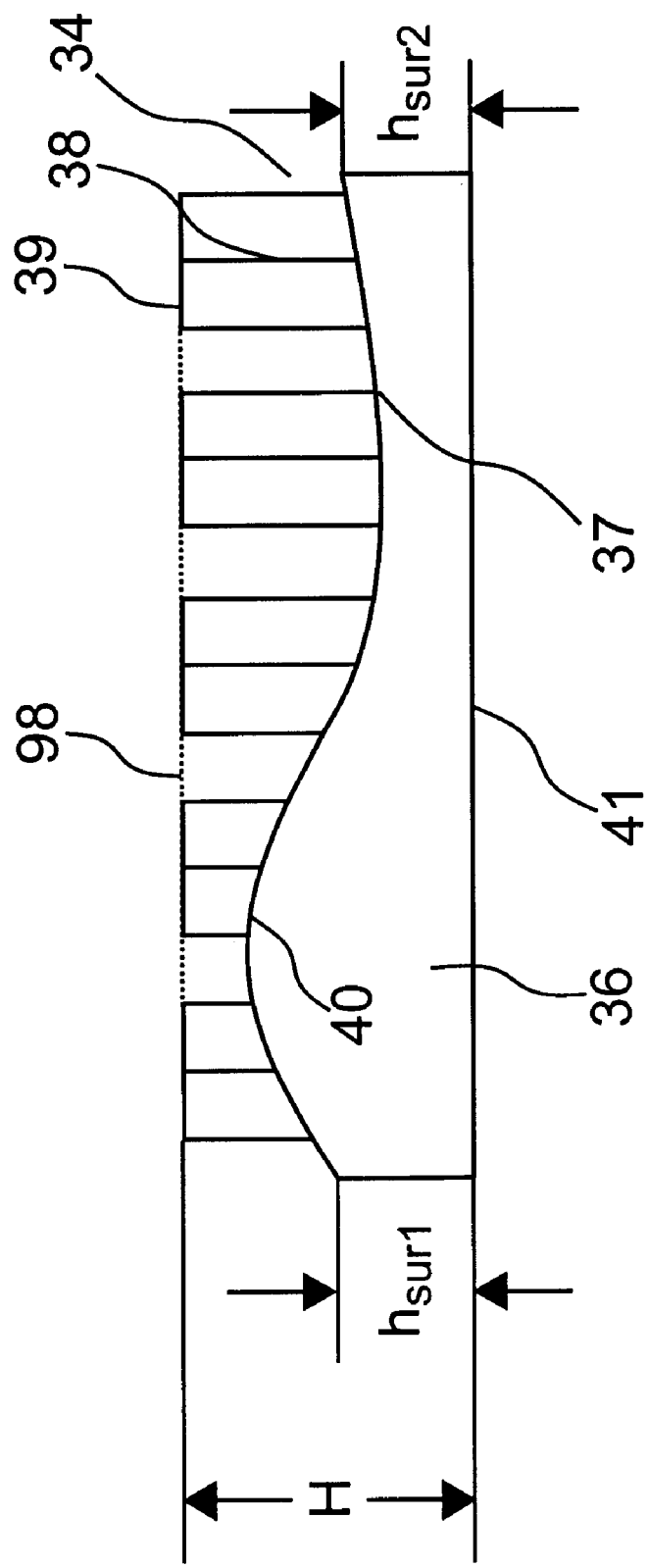
FIG. 23 is a diagrammatic side elevation view of an inventive heat sink embodiment characterized by a non-planar (curved) base surface such as shown in FIG. 22, illustrating terminal evenness (coextensiveness) of the pins.
Figure 24:
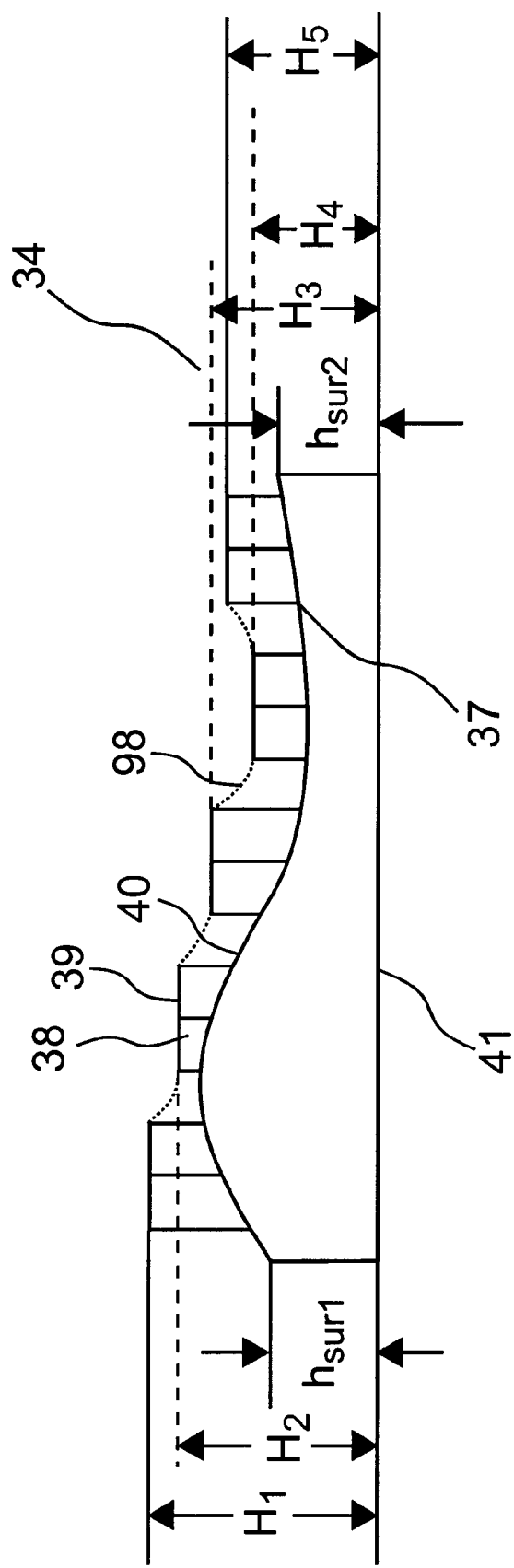
FIG. 24 is a diagrammatic side elevation view of an inventive heat sink embodiment characterized by a non-planar (curved) base surface such as shown in FIG. 22, illustrating terminal unevenness (noncoextensiveness) of the pins.

Upper foundation surface 40 is isometrically depicted in FIG. 22 to be non-planar. As shown in FIG. 22 through FIG. 24, upper foundation surface 40 can be inventively practiced so as to have any of a diversity of "topographies." The geometric configuration of an upper foundation surface 40 can be entirely planar, entirely non-planar, or some combination thereof. Assuming a planar (flat) lower foundation surface 41: If upper foundation surface 40 is planar, then the support post block foundation height $h_{sur}$ is constant; if the upper foundation'surface 40 is non-planar, then the heat sink foundation height $h_{sur}$ is variable.

The geometry of an upper foundation surface 40 can be characterized entirely by rectilinearity, entirely by curvilinearity, or by some combination thereof. A simple two-dimensional curve is shown in FIG. 22, wherein upper foundation surface 40 is curved in the x and z directions, but not curved in the y direction; however, it is readily envisioned, in light of this disclosure, that upper foundation surface 40 can be curved in any geometry in two dimensions (e.g., in the x and z directions, or the y and z directions) or three dimensions (e.g., in the x, y and z directions). In inventive practice, any random or rigid geometry may be used for upper foundation surface 40, such as, but not limited to, triangular, oval and sinusoidal.

Furthermore, the surface roughness of the flow cavity can be varied in accordance with the present invention. Irrespective of the essential geometry defined by upper foundation surface 40, the detailed geometry defined by upper foundation surface 40 can vary in terms of smoothness versus roughness. Not only the essential geometry, but also the detailed geometry of upper foundation surface 40, can be selected so as to affect the flow of fluid 42 in a desired fashion.

In addition to the different upper foundation surface 40 geometries, there can be variation in the contour 98 defined by pin ends 39. Pin ends 39 can define a contour 98 which is entirely planar, entirely non-planar, or some combination thereof. The geometry of contour 98 can be characterized entirely by rectilinearity, entirely by curvilinearity, or by some combination thereof. FIG. 23 and FIG. 24 are dissimilar; the pin ends 39 of pin 38 array shown in FIG. 23 define a planar (flat) contour 98, whereas the pin ends 39 of pin 38 array shown in FIG. 24 define a non-planar (curved) contour 98.

Figure 25:
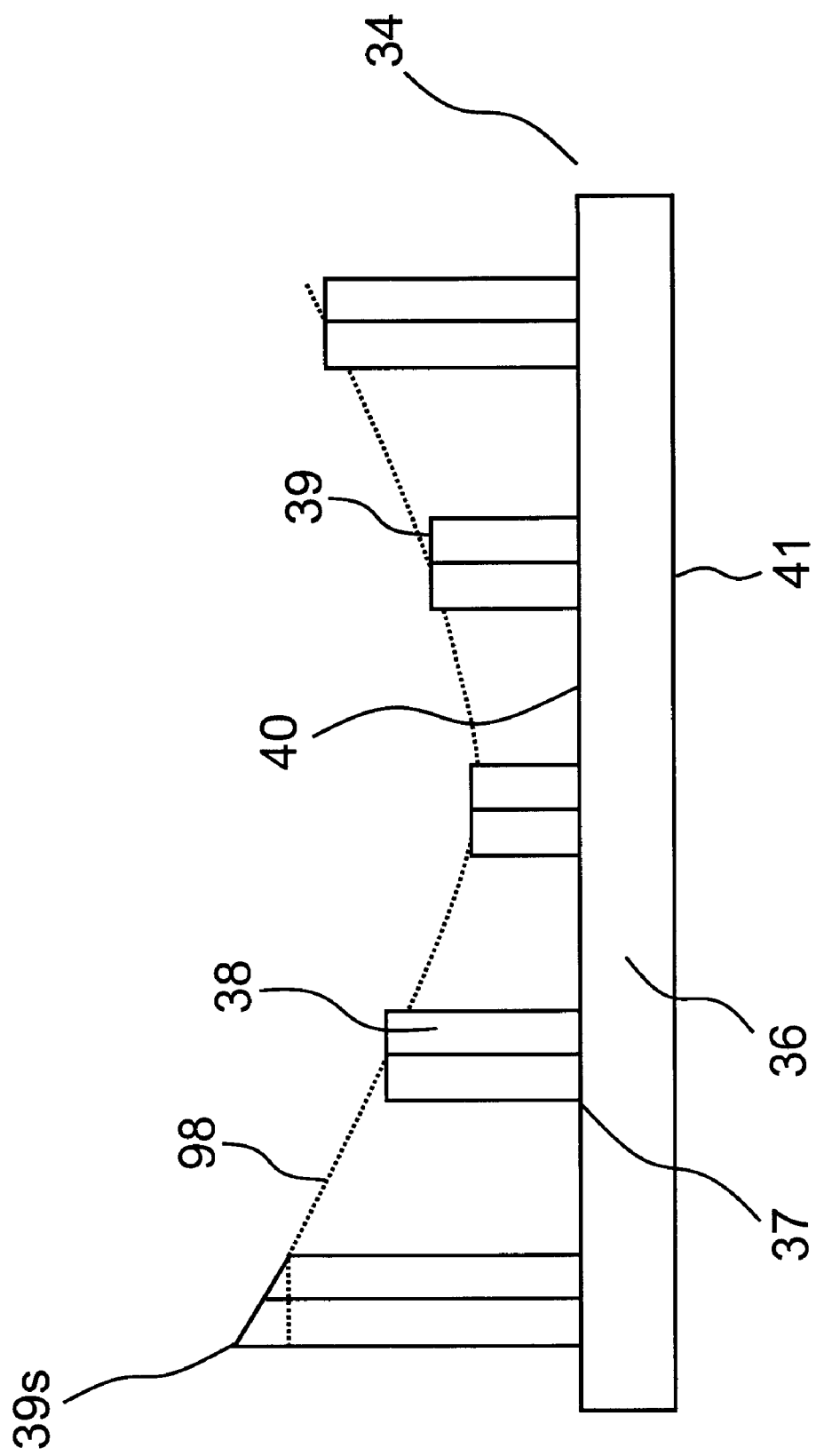
FIG. 25 is a diagrammatic side elevation view of a heat sink embodiment characterized by a planar (flat) base surface such as shown in FIG. 1 through FIG. 21, illustrating terminal unevenness (noncoextensiveness) of the pins.
Figure 26:
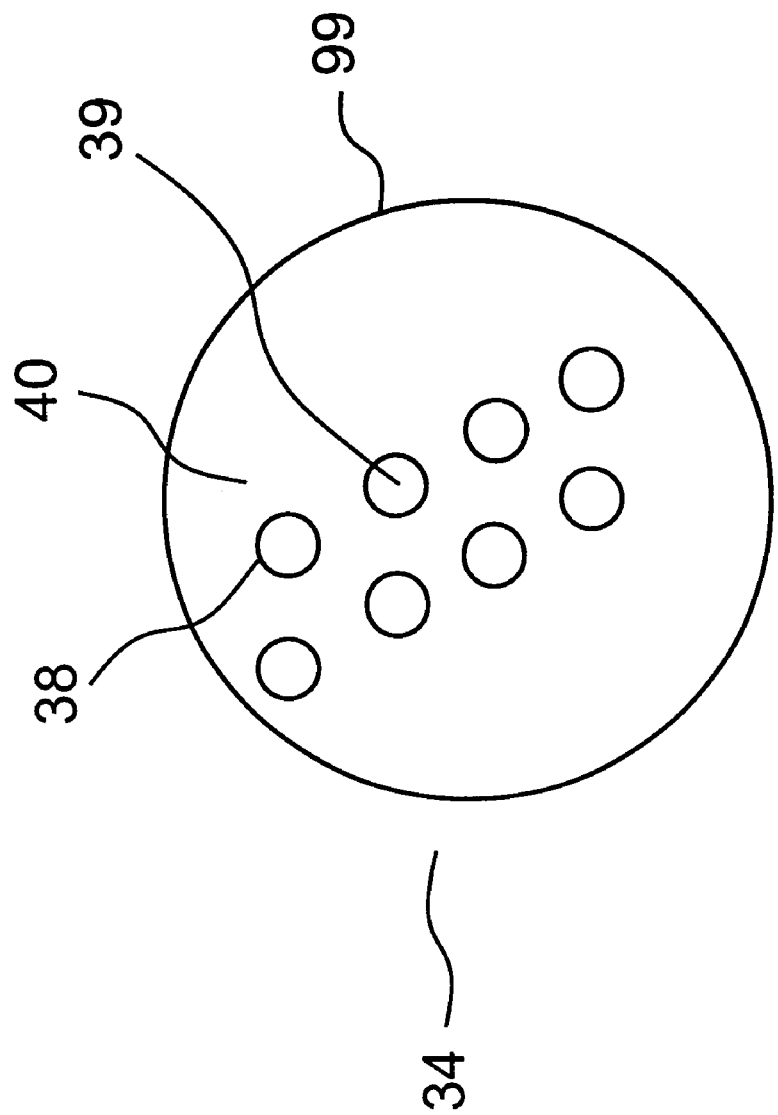
FIG. 26, FIG. 27, FIG. 28 and FIG. 29 are diagrammatic top plan views of an inventive heat sink embodiment wherein the base surface is shown to define a non-rectangular outline, more specifically a round (circular) outline, a triangular outline, a hexagonal outline and an irregular straight-and-curved outline, respectively.
Figure 27:
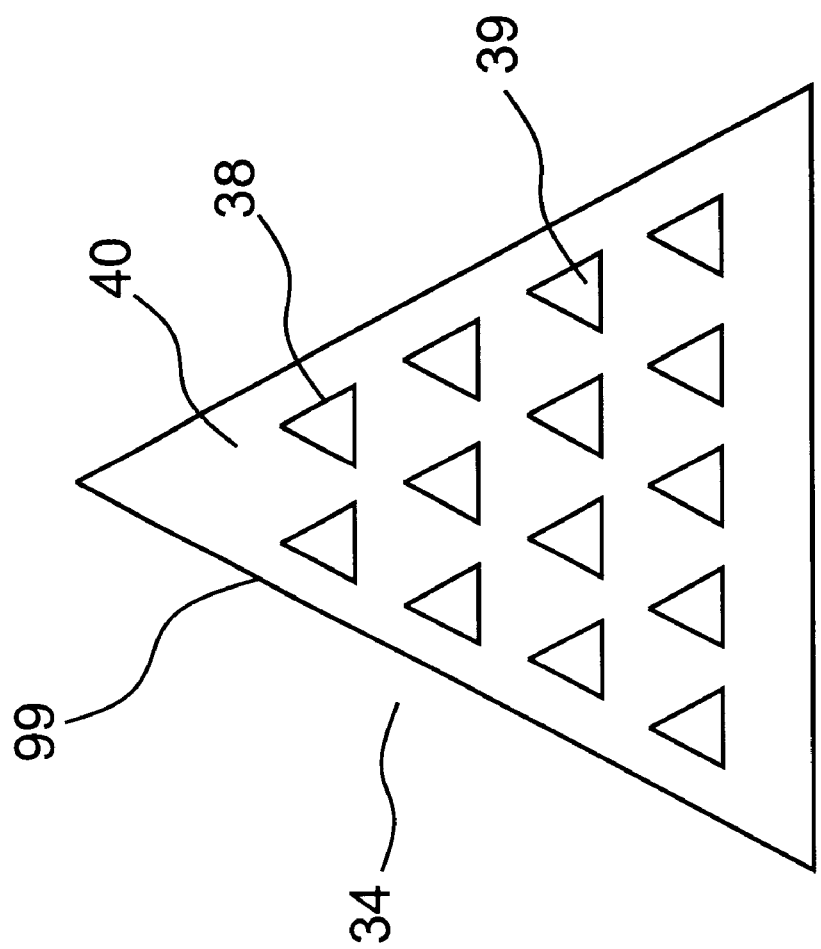
Figure 28:
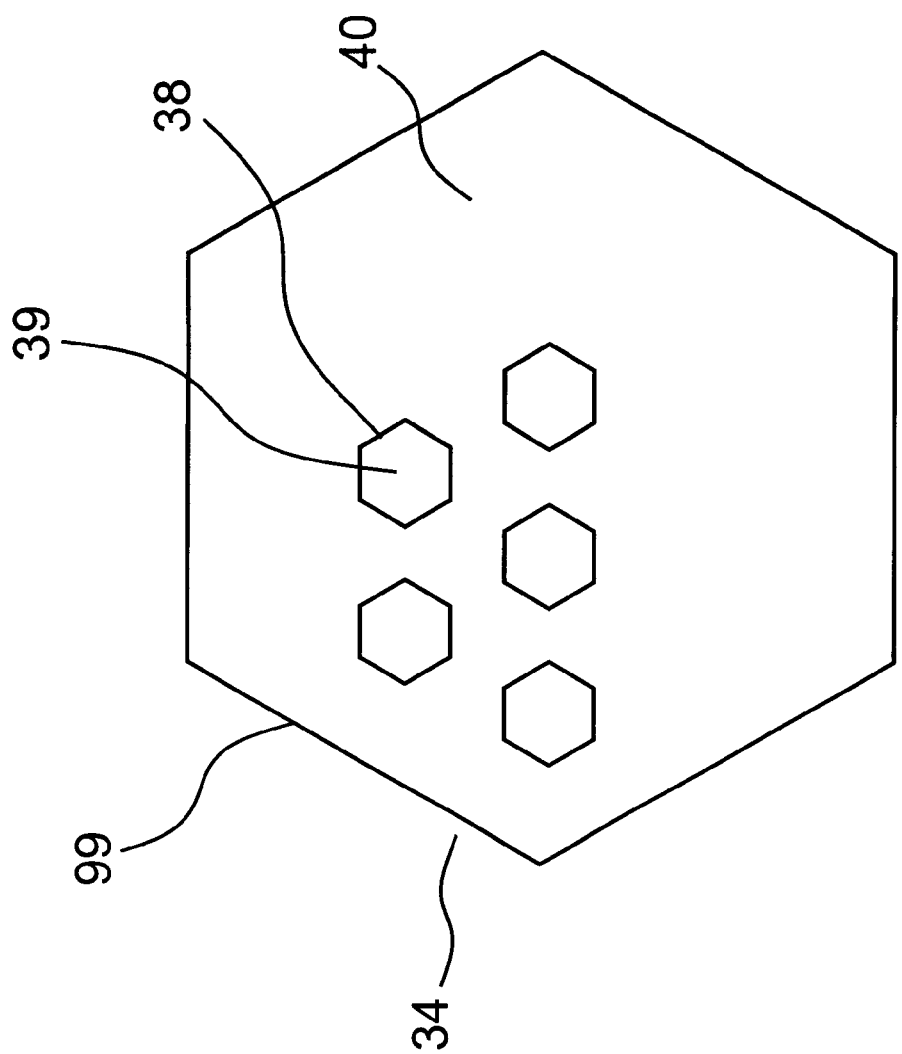
Figure 29:
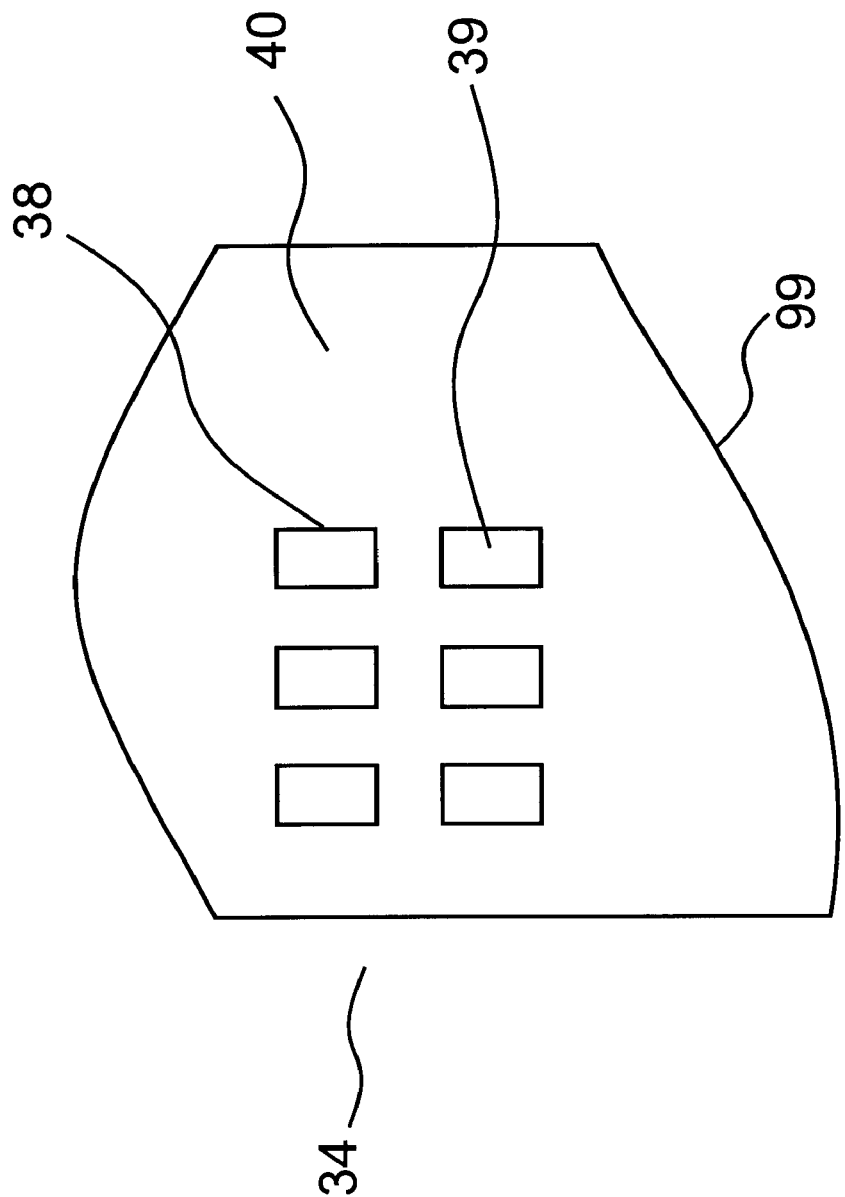

The foundations 36 shown in FIG. 1 through FIG. 21 each have a planar upper foundation surface 40 and a planar lower foundation surface 41. The foundations 36 shown in FIG. 22 through FIG. 24 each have a non-planar upper foundation surface 40 and a planar lower foundation surface 41. In FIG. 23, every pin 38 has the same total support block height H but its own uneven special pin height $h_{pin}$ (which varies in accordance with the foundation height $h_{sur}$ at the base (pin root 37) of pin 38, wherein foundation height $h_{sur}$ measures the distance between upper foundation surface 40 and lower foundation surface 41). In contrast, every pin 38 shown in FIG. 23 has a peculiar total support post block height H as well as a peculiar uneven special pin height $h_{pin}$. Like the foundations 36 shown in FIG. 1 through FIG. 21, the foundation 36 shown in FIG. 25 has a planar upper foundation surface 40 and a planar lower foundation surface 41; however, the special pin heights $h_{pin}$ vary (and, hence, the total support post block heights H vary), their pin ends 39 thereby describing a non-planar (curved) contour 98. The contours 98 shown in FIG. 24 and FIG. 25 are similar, despite the dissimilarity of the respective lower foundation surfaces 41 associated therewith.

Accordingly, inventive practice can render the pin heights so as to define a contour 98 which conforms with the geometry of the lower baseplate surface 58. The planar contour 98 shown in FIG. 23 would be more suitable for a planar lower baseplate surface 58, whereas the non-planar contours 98 shown in FIG. 24 and FIG. 25 would be more suitable for a non-planar lower baseplate surface 58. The pin ends 39 of any non-planar contour 98 can be rendered even more conformal with a non-planar lower baseplate surface 58 by providing concordant (e.g., slanted) pin end surfaces, such as pin end surface 39s shown in FIG. 25.

Further, according to this invention, adjustability (e.g., advanceability and retractability) of total support post block height(s) H can be provided so that contour 98 is adaptable to various lower baseplate surfaces 58. Pin 38 array can be made as part of an insertable and removable auxiliary device which can be changed based upon the particular application. For instance, support post block 34 shown in FIG. 1 can represent such an auxiliary device. Replacable support post block 34, including its array of elongated pins 38, fits inside manifold cavity 35, which is provided in manifold 33. Support post block 34 is situated within manifold cavity 35 so that lower foundation surface 41 faces downward and upper foundation surface 40 faces upward, pins 38 thereby projecting outwardly from manifold cavity 33. Thus, according to many inventive embodiments, the pin array-inclusive device (such as support post block 34) is an auxiliary device which is introducible into and withdrawable out of a housing (such as manifold 33).

Most of the figures herein portray an upper foundation surface 40 which is characterized by a rectangular outline shape, upper foundation surface 40 thus having a length L and a width W. This invention can be practiced with an upper upper foundation surface 40 having any of a variety of geometric configurations. As shown in FIG. 26 through FIG. 29, upper foundation surface 40 has various non-rectangular outline shapes 99, viz., circular, triangular, hexagonal and irregular rectilinear-curvilinear, respectively.

In general, the examples described herein have involved support post blocks 34 having a lower foundation surface 41 which is planar (flat). Some inventive embodiments provide a non-planar lower foundation surface 41 which is conformable to, or otherwise suitable for engagement with, another surface which will underlie or abut lower foundation surface 41.

It is reemphasized that the present invention can be practiced in association with any among a multiplicity of geometries. Any of the pin 38 array patterns illustrated in the drawings (and many others not specifically shown) can be inventively practiced regardless of the geometric nature (e.g., planar or non-planar) of upper foundation surface 40, lower foundation surface 41, pin end contour 98 or heat sink outline 99.

Figure 30:
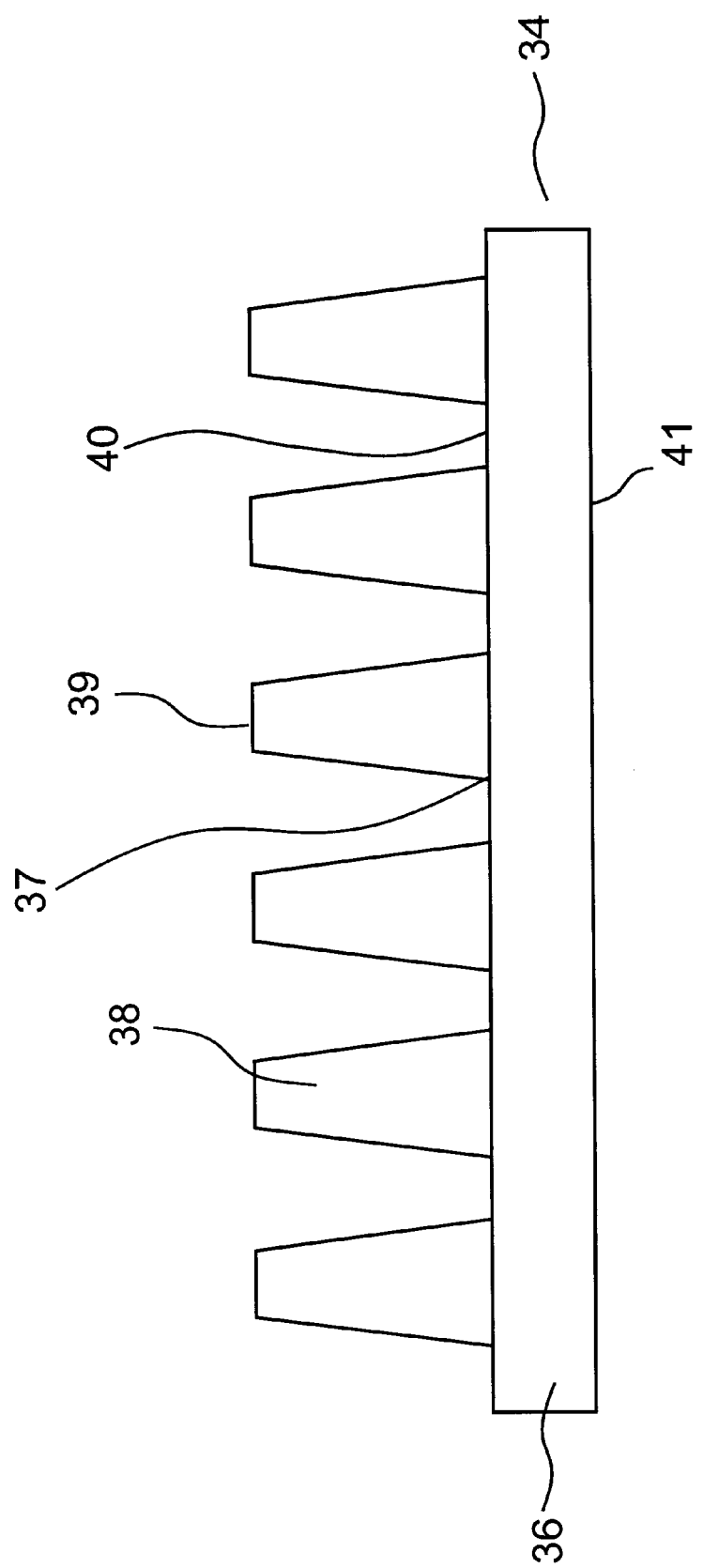
FIG. 30 is a diagrammatic side elevation view of another inventive embodiment of a heat sink device, wherein the turbulence-enhancing support pins are illustrated to be characterized by a tapered shape.
Figure 31:
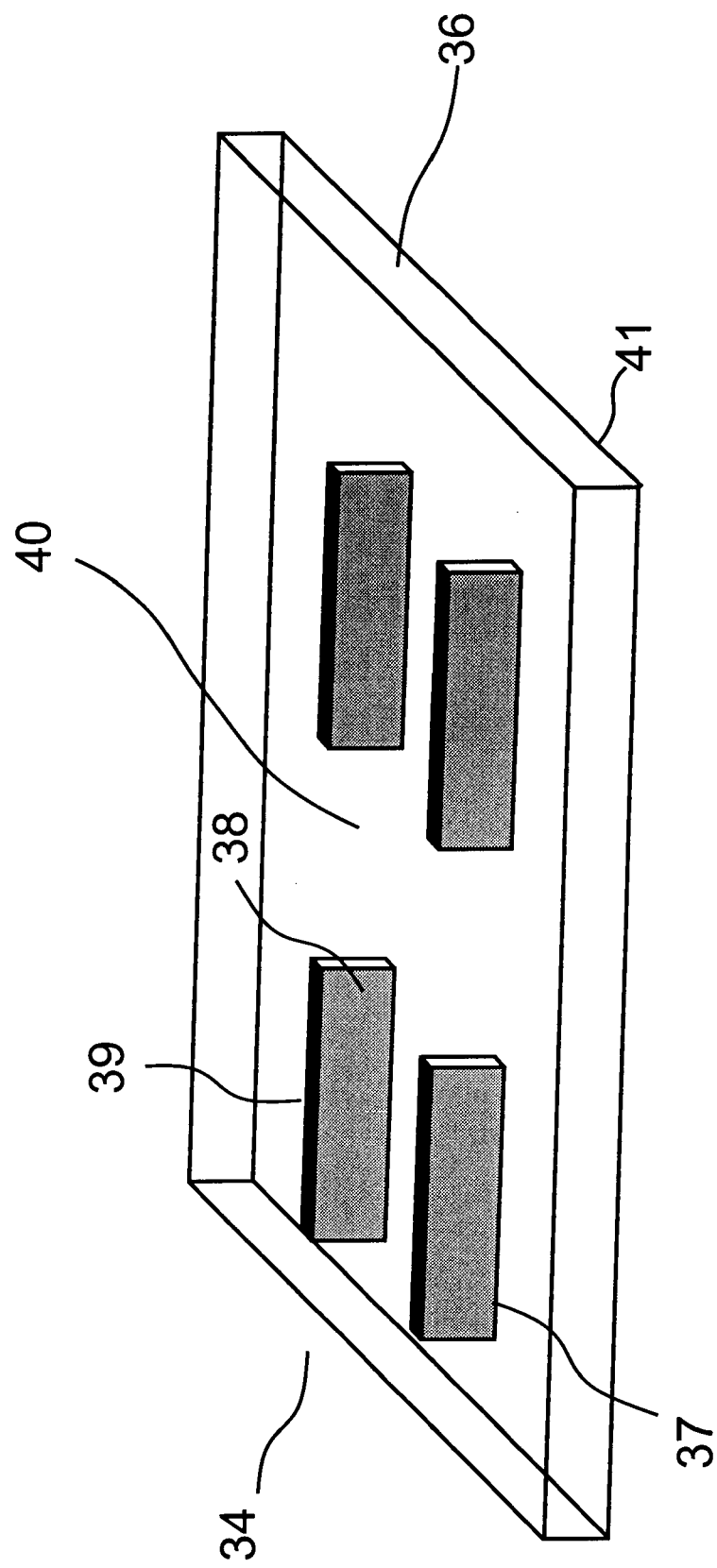
FIG. 31 is a diagrammatic perspective view of another inventive embodiment of a heat sink device, wherein the turbulence-enhancing support pins are illustrated to be characterized by a fin shape.

Support pins 38 are shown in the previous figures to have unvarying cross-sectional geometry, thus having uniform thickness from top to bottom. Pins 38 can be tapered so that they are larger toward pin roots 37 and smaller toward top pin ends 39, for example as shown in FIG. 30. A tapered pin 38 geometry could prove advantageous by decreasing the size of the pin end 39 surface which would be in contact with lower baseplate surface 58. Irregular shapes such as fins can also be inventively implemented, for example as shown in FIG. 31. In the light of this disclosure, any of the pin 38 arrays depicted herein as entailing longitudinally even pin 38 geometries can similarly be envisioned to entail longitudinally uneven (e.g., tapered) or irregular (e.g., fin-like) pin 38 geometries.

Figure 32:
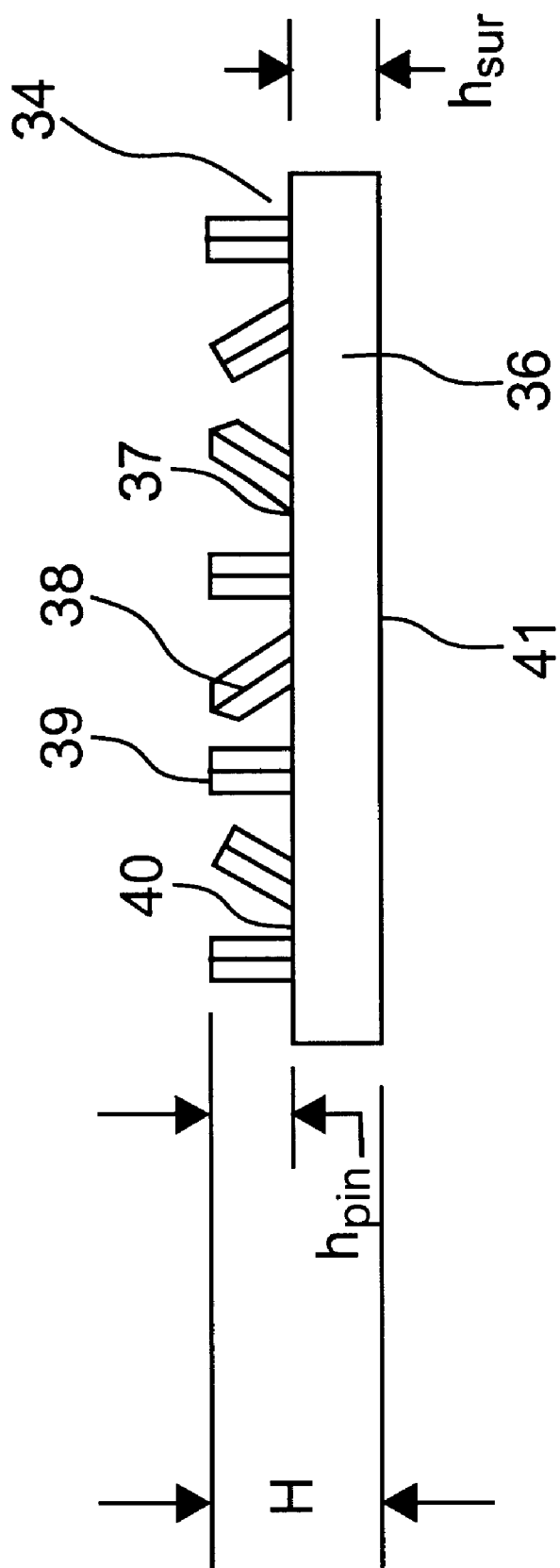
FIG. 32 is a diagrammatic side elevation view of another inventive embodiment of a heat sink device, wherein the turbulence-enhancing support pins are illustrated to be characterized by nonparallel (oblique) orientations.

Support pins 38 are shown in the previous figures to be approximately parallel with respect to each other; that is, pins 38 can be conceived to describe corresponding longitudinal axeswhich are approximately parallel. When upper foundation surface 40 is shown to be flat, each pin 38 is shown to be approximately normal with respect to upper foundation surface 40. Referring to FIG. 32, inventive practice can prescribe parallelism of two or more pins 38 and/or nonparallelism of two or more pins 38. According to this invention, all pins 38 can be approximately parallel to each other and approximately perpendicular to a flat upper foundation surface 40. Alternatively, all pins 38 can be approximately parallel to each other and oblique with respect to a flat upper foundation surface 40. Or, some pins 38 can be parallel and some pins 38 can be oblique. FIG. 32 illustrates how, in accordance with the present invention, pins 38 can manifest practically any orientation with respect to each other and practically any orientation with respect to upper foundation surface 40.

Figure 33:
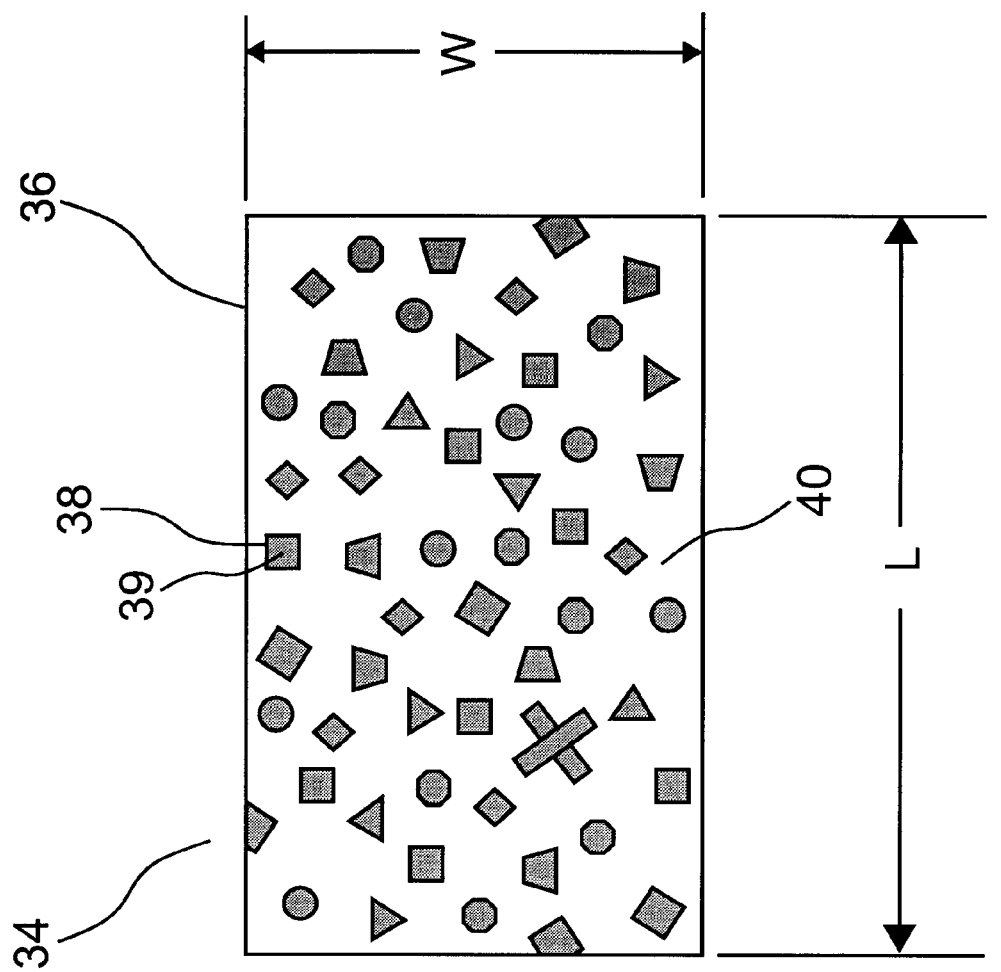
FIG. 33 is a diagrammatic top plan view of another inventive embodiment of a heat sink device, wherein the turbulence-enhancing support pins are illustrated to be characterized by non-uniformity or randomness in terms of their shapes, sizes, positions and overall arrangement.
Figure 34:
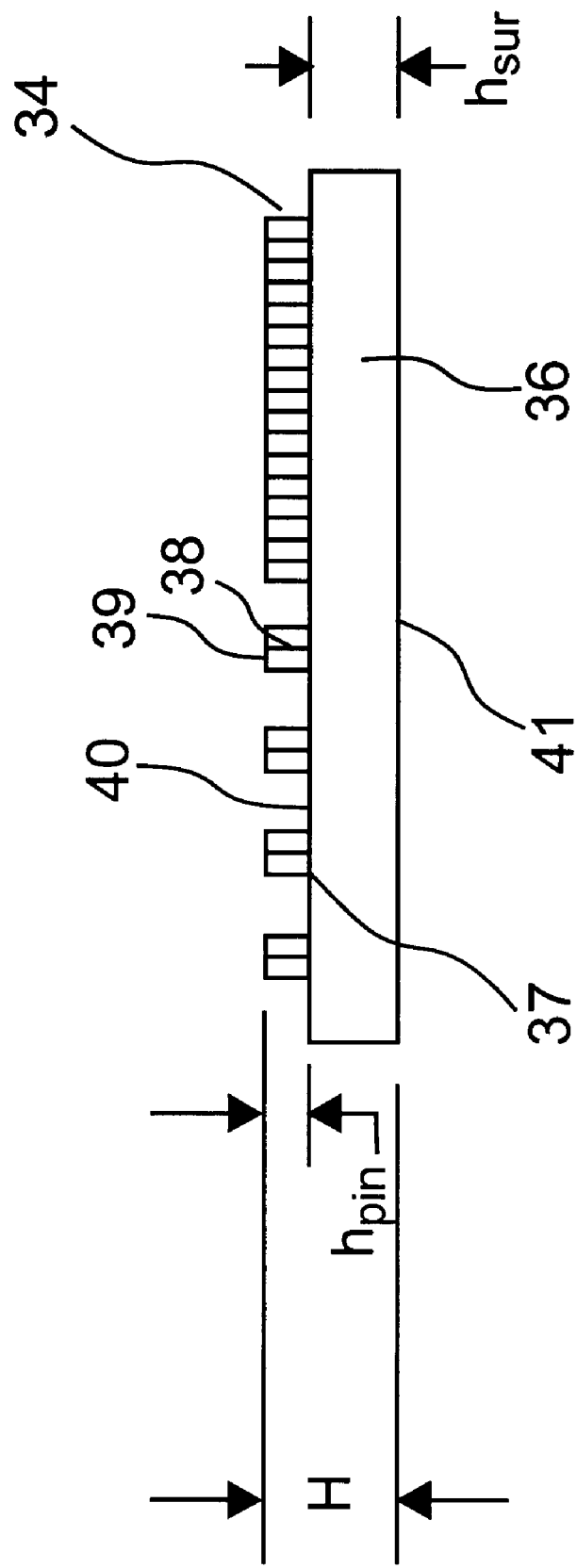
FIG. 34 is a diagrammatic side elevation view of another inventive embodiment of a heat sink device, wherein the turbulence-enhancing support pins are illustrated to be characterized by regionalization of the pin locations.

Every pin 38 array depicted in the previous drawings is characterized by cross-sectional geometric identity or sameness of the pins 38. In inventive practice, the pins typically, but not necessarily, have the same cross-sectional geometries. For instance, with reference to FIG. 33, a pin 38 array can represent a randomly arranged and "hybridized" combination of variously shaped pins 38. As shown in FIG. 33, the rows are in random order and not parallel. Further, pins 38 are represented by different geometric entities.

Hence, two or more types of geometrically shaped pins 38 can be combined in one support post block 34. For example, a single support post block 34 can include at least one triangular pin 38, at least one elliptical pin 38, at least one rectangular pin 38, at least one octagonal pin 38, at least one irregularly shaped pin, etc.

Another possible mode of inventive "hybridization" would involve the regionalization of various pin 38 array patterns. For instance, a first section of the pin 38 array exhibits a particular staggered distribution modality, while a second section thereof exhibits a particular non-staggered distribution modality. It is also possible in inventive practice to combine the two hybridization themes of cross-sectional differentiation and distributional differentiation.

Again referring to FIG. 2 through FIG. 4, pins 38 are shown to be made part of the overall support post block 34 structure, protruding from the upper foundation surface 40 of foundation 36, toward and contacting the lower baseplate surface 58 of device baseplate 57. However, inventive practice can provide for the fabrication of pins 38 as part of the power conversion module 46 structure rather than as part of the support post block 34 structure. Generally according to such inventive embodiments, pins 38 would extend downward from lower baseplate surface 58 of device baseplate 57, instead of extending upward from upper foundation surface 40 of foundation 36. In other words, pins 38 would protrude from lower baseplate surface 58 of device baseplate 57, toward and contacting the upper foundation surface 40 of foundation 36. Thus, rather than extend upward so as to contact the top of the coolant flow passage, pins 38 would be extending downward so as to contact the bottom of the coolant flow passage, thereby comparably providing support for device baseplate 57 (and, hence, power conversion module 46).

In addition, not all of the pins 38 need to project so as to contact the opposite surface. In typical inventive practice, every pin 38 projects from upper foundation surface 40 so as to contact lower baseplate surface 58. However, one or more pins 38 can intentionally be rendered "short" (i.e., not contacting lower baseplate surface 58), thereby affording different flow characteristics. This principle can be effectuated whether pins 38 project from upper foundation surface 40 toward lower baseplate surface 58, or from lower baseplate surface 58 toward upper foundation surface 40.

In inventive practice, components can be made from a wide variety of materials, generally at least in part depending upon whether or not corrosion is a concern. In particular, the support pin 38 array can have a composition selected from a diversity of materials. Selection of the pin 38 material composition would depend upon various factors, such as the material composition of device baseplate 57, the significance of corrosiveness, the supportability of such material composition in relation to power conversion module 46, or other material compatibility concerns. Pins 38 can comprise metal, metal alloy, plastic, rubber, wood, etc.

There are numerous fluids (gaseous or liquid) which are conventionally used for cooling purposes in heat sink applications, any of which can be used in practicing the present invention. Air is commonly used to dissipate low heat fluxes, such as in desktop computers.

Depending on the specific application, utilization of liquids for the cooling of electronic equipment is generally governed by certain requirements, principles and considerations. Among the many such requirements, principles and considerations which would possibly be applicable in inventive practice are the following: (i) A high thermal conductivity will yield a high heat transfer rate. (ii) High specific heat of the fluid will require a smaller mass flow rate of the fluid. (iii) Low viscosity fluids will cause a smaller pressure drop, and thus require a smaller pump. (iv) Fluids with a high surface tension will be less likely to cause leakage problems. (v) A fluid (e.g., liquid) with a high dielectric strength is not required in direct fluid (e.g., liquid) cooling. (vi) Chemical compatibility of the fluid and the heat sink material is required to avoid problems insofar as the fluid reacting to the material with which it comes in contact. (vii) Chemical stability of the fluid is required to assure that the fluid does not decompose under prolonged use. (viii) Nontoxic fluids are safe for personnel to handle and use. (ix) Fluids with a low freezing point and a high boiling point will extend the useful temperature ranges of the fluid; however, for most practical applications, a fluid should be selected to meet the operating conditions of the component to be cooled. (x) Low cost is desirable to maintain affordable systems.

Fluid-cooled heat sinks used in electronic enclosures and such contexts are usually water-cooled. The heat sink is cooled by the water which is passed therethrough. In many electronic applications, distilled or demineralized water is used to increase the dielectric strength of the water, thereby avoiding electrically coupling components. High heat removal rates can be achieved by circulating water systems. Anhydrous refrigerants are used in place of water to keep temperatures of heat sinks at subzero temperatures, thereby increasing the performance of the electronic components. Examples of refrigerants other than water include ammonia, carbon dioxide, CFC-based refrigerants such as R-12 (dichlorodifluoromethane or "freon"), HCFC-based refrigerants such as R134A, and non-CFC substitutes (e.g., for freon) such as R-406A.

The U.S. Navy, during testing of the inventive apparatus, used water in its liquid form as the coolant. The U.S. Navy preferred liquid (deionized or demineralized) water as the coolant due to many factors (environmentally benign, low cost, availability, simplicity of design, non-health hazard, low corrosivity, compatibility with most materials, ease of use, etc.).

Other embodiments of this invention will be apparent to those skilled in the art from a consideration of this specification or practice of the invention disclosed herein. Various omissions, modifications and changes to the principles described may be made by one skilled in the art without departing from the true scope and spirit of the invention which is indicated by the following claims.

What is claimed is:

1. A heat sink device comprising a structure which includes a foundation section and plural thermally nonconductive protrusions, said foundation section having an upper surface, said protrusions being situated on said upper surface, said structure being adaptable to engagement with an object and to combination with a fluid wherein:

at least some said protrusions and said object touch;
   said fluid streams generally linearly and generally unidirectionally, and streams generally contactingly and generally in parallel with respect to said upper surface and with respect to said object;
   there is approximately no conductive heat transfer from said object to said foundation section; and
   at least some said protrusions affect said streaming of said fluid so as to enhance the turbulence of said streaming of said fluid, thereby enhancing convective heat transfer from said object to said fluid.

2. The heat sink device as in claim 1, comprising said fluid and means for causing said streaming of said fluid.

3. The heat sink device as in claim 1, wherein said protrusions are approximately parallel to each other, wherein said upper surface is approximately planar, and wherein said protrusions are approximately perpendicular to said upper surface and are distributed thereon in an approximately regular pattern, said structure being adaptable to engagement with said object and to combination with said fluid wherein:

said fluid streams across said upper surface; and
   said convective heat transfer is at least substantially uniform over said upper surface.

4. The heat sink device as in claim 3, said structure being adaptable to being disposed wherein said upper surface is approximately horizontal and wherein said protrusions are approximately vertical.

5. The heat sink device as in claim 1, wherein said protrusions are approximately parallel to each other, wherein said upper surface is non-planar, and wherein said protrusions are distributed thereon in an approximately regular pattern.

6. The heat sink device as in claim 5, said structure being adaptable to being disposed wherein said protrusions are approximately vertical, and wherein said protrusions at least partially support said object.

7. The heat sink device as in claim 1, wherein said fluid is a cooling fluid having at least one characteristic selected from the group consisting of liquid, gaseous, hydrous and anhydrous.

8. The heat sink device as in claim 1, wherein said pins are at least substantially dielectric.

9. The heat sink device as in claim 1, wherein said structure is at least substantially dielectric.

10. The heat sink device as in claim 1, wherein each said protrusion has a cross-sectional shape selected from the group consisting of rectilinear, curvilinear and both rectilinear and curvilinear.

11. The heat sink device as in claim 1, wherein said foundation section is thermally nonconductive, and wherein said structure is a unitary said structure which is thermally nonconductive.

12. The heat sink device as in claim 3, said heat sink device comprising said fluid and means for causing said streaming of said fluid, said means for causing said streaming of said fluid including a fluid inlet means and a fluid outlet means, said lower surface being approximately characterized by a length and two opposite ends, said structure being adaptable to engagement with said object and to combination with said fluid wherein:

said fluid inlet means is located approximately at a first said end;
   said fluid outlet means is located approximately at a second said end; and
   said fluid streams approximately along said length.

13. The heat sink device as in claim 1, said structure being adaptable to engagement with said object and to combination with said fluid wherein at least some said protrusions mechanically support said object.

14. The heat sink device as in claim 1, said upper surface being approximately planar, said protrusions being approximately normal to said upper surface and parallel to each other, said object having an approximately planar object surface portion, said structure being adaptable to engagement with said object and to combination with said fluid wherein said protrusions are approximately normal to said planar object surface and wherein said upper surface and said planar object surface are approximately parallel to each other.

15. Cooling apparatus for application to a body, said apparatus comprising fluidity means and a member, said body having a body surface portion, said member having a member surface portion and a plurality of pins projecting therefrom, said pins being made of a thermally nonconductive material, said pins each having a pin end surface portion opposite said member surface portion, said fluidity means including means emissive of a fluid which is flowable in a generally straight flow direction contiguously along said member surface portion and said body surface portion when said body surface portion communicates with at least some said pin end surface portions, there being an essentially non-thermal interface between said body and said member during said communication, there being the generation of turbulence by at least some said pins during said flow, wherein as a result of said non-thermal interface said apparatus effects said cooling of said body at least substantially in the absence of thermal conduction between said body and said member, and wherein as a result of said turbulence said apparatus effects said cooling of said body at least substantially via thermal convection between said body and said fluid.

16. The cooling apparatus as in claim 15, wherein at least two said pins are oblique with respect to each other.

17. The cooling apparatus as in claim 15, wherein said pins are approximately parallel with respect to each other, wherein said pins are approximately uniformly distributed upon said member surface portion, and wherein said cooling of said body is approximately uniformly effected with respect to said body surface portion with which said flow is contiguous.

18. The cooling apparatus as in claim 17, wherein said member surface portion is approximately flat, said pins are each approximately orthogonal to said member surface portion, and said pin end surface portions are each approximately flat.

19. The cooling apparatus as in claim 18, wherein said pin end surface portions are approximately coplanar.

20. The cooling apparatus as in claim 18, wherein at least two said pin end surface portions are not coplanar.

21. The cooling apparatus as in claim 17, wherein said member surface portion is curved and said pin end surface portions are each approximately flat.

22. The cooling apparatus as in claim 21, wherein said pin end surface portions are approximately coplanar.

23. The cooling apparatus as in claim 21, wherein at least two said pin end surface portions are not coplanar.

24. The cooling apparatus as in claim 17, wherein said fluid is a coolant selected from the group consisting of water and air.

25. The cooling apparatus as in claim 15, wherein said pins are made of a nonmetallic thermally nonconductive material, and wherein said member is an integral member made of a nonmetallic thermally nonconductive material.

26. The cooling apparatus as in claim 15, wherein said member surface portion is approximately planar, said pins are approximately parallel with respect to each other and approximately perpendicular with respect to said member surface portion, and wherein said pins are configured so as to describe an at least substantially regular motif.

27. The cooling apparatus as in claim 26, wherein said member surface portion has a length and a width, wherein said motif is characterized by at least two lengthwise alignments and at least two widthwise alignments of said pins, each said alignment being of at least two said pins, wherein said flow direction is approximately in the direction of one of said length and said width, and wherein said cooling of said body is characterized by approximate uniformity with respect to said body surface portion with which said flow is contiguous.

28. The cooling apparatus as in claim 26, wherein each said pin end surface portion defines a shape selected from the group consisting of circular, non-circular elliptical, triangular, rectangular, non-rectangular quadrilateral and at least five-sided polygonal.

29. The cooling apparatus as in claim 26, wherein said motif is characterized by plural rows of said pins, each said row having plural said pins, said rows being approximately parallel and being approximately non-staggered in relation to each other, said rows thereby describing plural columns of said pins, said columns being approximately parallel in relation to each other, each said column having plural said pins, said rows and said columns being approximately perpendicular in relation to each other, said rows being disposed generally at an approximately zero angled parallelism in relation to said flow direction.

30. The cooling apparatus as in claim 26, wherein said motif is characterized by plural rows of said pins, each said row having plural said pins, said rows being approximately parallel and being staggered in relation to each other, said rows thereby describing plural diagonals and plural cross-diagonals of said pins, each said diagonal and each said cross-diagonal having plural said pins, said rows being oblique with respect to said diagonals and with respect to said cross-diagonals, said rows being disposed generally at an approximately zero angled parallelism in relation to said flow direction.

31. The cooling apparatus as in claim 30, wherein:
said diagonals are parallel to each other;
said cross-diagonals are perpendicular to said diagonal alignments and are parallel to each other; and
said diagonals are each oriented at a first oblique angle with respect to said rows;
said cross-diagonals are each oriented at a second oblique angle with respect to said rows; and
said first oblique angle and said second oblique angle are equal.

32. The cooling apparatus as in claim 31, wherein said first angle and said second angle are each approximately forty-five degrees.

33. The cooling apparatus as in claim 27, comprising a manifold for housing said member, for directing said fluid and for attaching to said body, said manifold including a fluid inlet and a fluid outlet, said fluid inlet and said fluid outlet being situated at approximately opposite ends of one of said length and said width.

34. The cooling apparatus as in claim 33, wherein said pins are characterized by sufficient structural integrity so that said manifold and at least some said pins, in combination, are capable of mechanically supporting said body.

35. The cooling apparatus as in claim 15, wherein at least some said pins are characterized by sufficient structural integrity for, at least partially, mechanically supporting said body.

36. The cooling apparatus as in claim 15, wherein said pins are approximately parallel with respect to each other, wherein said pin end surface portions define a contour, and wherein said body surface portion approximately conforms with said contour.

37. The cooling apparatus as in claim 30, wherein said rows are disposed generally at an approximately zero angled parallelism in relation to said flow direction.

38. A method for cooling an entity, said method comprising:
providing a device having a device surface area and plural thermally nonconductive members which jut from said device surface area, said members having corresponding extremities opposite said device surface area;
coupling said entity with said device, said entity having an entity surface area, said coupling including placing said entity surface area in contact with at least some said extremities whereby a thermally nonconductive bond is formed between said entity and said device; and discharging fluid in an approximately linear flow direction adjoiningly between and along said device surface area and said entity surface area so as to be disturbed by at least some said members, said members increasing the flow turbulence of said fluid whereby convective thermal transfer is effectuated from said entity to said fluid.

39. The method for cooling an entity as in claim 38, wherein said members are approximately parallel, wherein said method comprises positioning said device so that said members are approximately vertical, and wherein said placing is performed so that said entity rests atop said device, said members thereby at least partially supporting said device.

40. The method for cooling an entity as in claim 38, wherein said device includes a frame for said device surface area, and wherein said coupling includes mounting said entity onto said frame.

41. A self-cooling assembly comprising a replenishably and approximately linearly flowing fluid, a thermally conductive first body having an approximately flat first surface, a second body having an approximately flat second surface, and an approximately homogeneous arrangement of approximately parallel, approximately congruent, thermally nonconductive pins; said arrangement of said pins being interposed between said first body and said second body so that said first surface and said second surface face each other; said arrangement of said pins thereby establishing a thermally nonconductive connection between said first body and said second body; said fluid flowing adjacently between, along and across said first surface and said second surface so as to be agitated by said arrangement of said pins; said arrangement of said pins thereby causing turbulence in said fluid so as to encourage the convective transference of heat from said first body to said fluid; said first body thereby being convectively and nonconductively cooled in an approximately homogenous manner over said first surface.

* * * * *